US012193279B2

(12) United States Patent
Kim et al.

(10) Patent No.: US 12,193,279 B2
(45) Date of Patent: Jan. 7, 2025

(54) DISPLAY DEVICE INCLUDING COLOR ABSORBING LAYER BETWEEN CAPPING AND BANK LAYERS FOR IMPROVING COLOR MATCHING, AND METHOD OF PROVIDING THE SAME

(71) Applicant: Samsung Display Co., LTD., Yongin-si (KR)

(72) Inventors: Jeong Ki Kim, Hwaseong-si (KR); Won Ji Gu, Seoul (KR); Jong Hoon Kim, Seoul (KR); Jea Heon Ahn, Hwaseong-si (KR); Ji Seong Yang, Suwon-si (KR); Hwa Yeul Oh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/520,805

(22) Filed: Nov. 28, 2023

(65) Prior Publication Data

US 2024/0099074 A1 Mar. 21, 2024

Related U.S. Application Data

(62) Division of application No. 17/325,380, filed on May 20, 2021, now Pat. No. 11,903,261.

(30) Foreign Application Priority Data

Jun. 22, 2020 (KR) ........................ 10-2020-0075574

(51) Int. Cl.
*H10K 59/122* (2023.01)
*H10K 59/35* (2023.01)
(Continued)

(52) U.S. Cl.
CPC ......... *H10K 59/122* (2023.02); *H10K 59/353* (2023.02); *H10K 59/38* (2023.02); *H10K 71/00* (2023.02)

(58) Field of Classification Search
CPC .. H10K 50/865; H10K 59/122; H10K 59/353; H10K 59/35; H10K 59/38;
(Continued)

(56) References Cited

U.S. PATENT DOCUMENTS

2018/0211979 A1* 7/2018 Lee ..................... H01L 27/1222
2020/0159065 A1* 5/2020 Kim .................. H10K 59/8792
(Continued)

FOREIGN PATENT DOCUMENTS

EP 3355357 A1 8/2018
EP 3654383 A1 5/2020
(Continued)

OTHER PUBLICATIONS

European Search Report for European Patent Application 21180605.4 dated Apr. 7, 2022.

*Primary Examiner* — Matthew E. Gordon
(74) *Attorney, Agent, or Firm* — CANTOR COLBURN LLP

(57) ABSTRACT

A display device includes a first display substrate including a light emitting element which emits light of a first color or light of a second color different from the first color, a second display substrate including in order toward the first display substrate, a layer including both a bank layer defining an opening and a wavelength control pattern in the opening, a capping layer covering the wavelength control pattern and the bank layer, and a color absorbing layer which corresponds to the bank layer and blocks the light of the first color and the light of the second color. The capping layer includes a first area corresponding to the color absorbing layer, the
(Continued)

bank layer includes a second area corresponding to the color absorbing layer, and the first area of the capping layer is between the color absorbing layer and the second area of the bank layer.

3 Claims, 15 Drawing Sheets

(51) Int. Cl.
*H10K 59/38* (2023.01)
*H10K 71/00* (2023.01)

(58) Field of Classification Search
CPC .... H10K 59/8792; H10K 71/00; H10K 71/40; H10K 71/421; H10K 71/441
USPC .......................................................... 257/40
See application file for complete search history.

(56) References Cited

U.S. PATENT DOCUMENTS

| | | | | |
|---|---|---|---|---|
| 2020/0161579 | A1* | 5/2020 | Kim | H10K 59/126 |
| 2020/0328256 | A1* | 10/2020 | Lee | H10K 50/84 |
| 2021/0050388 | A1* | 2/2021 | Song | H10K 50/865 |
| 2021/0151510 | A1 | 5/2021 | Lee et al. | |

FOREIGN PATENT DOCUMENTS

| | | | |
|---|---|---|---|
| EP | 3657238 | A1 | 5/2020 |
| EP | 3726584 | A1 | 10/2020 |
| KR | 1020190009871 | A | 1/2019 |
| KR | 1020190014140 | A | 2/2019 |
| KR | 1020190093823 | A | 8/2019 |
| KR | 1020200117093 | A | 10/2020 |

* cited by examiner

TA: TA1, TA2, TA3
PXS: PXS_1, PXS_2, PXS_3
EMA: EMA1, EMA2, EMA3

DISPLAY DEVICE INCLUDING COLOR ABSORBING LAYER BETWEEN CAPPING AND BANK LAYERS FOR IMPROVING COLOR MATCHING, AND METHOD OF PROVIDING THE SAME

This application is a divisional application of U.S. application Ser. No. 17/325,380 filed May 20, 2021, which claims priority to Korean Patent Application No. 10-2020-0075574 filed on Jun. 22, 2020, and all the benefits accruing therefrom under 35 U.S.C. 119, the contents of which in its entirety are herein incorporated by reference.

BACKGROUND

1. Field

The disclosure relates to a display device and a method of providing the same.

2. Description of the Related Art

The importance of display devices has steadily increased with the development of multimedia technology. Accordingly, various types of display devices such as a liquid crystal display ("LCD"), an organic light emitting display ("OLED") and the like have been used.

The display devices include a self-light emitting display device which includes a self-light emitting element such as an organic light emitting diode and excludes a separate power source. The self-light emitting element may include two opposing electrodes and a light emitting layer which is interposed therebetween. In the organic light emitting diode as the self-light emitting element, the electrons and holes from the two electrodes are recombined in the light emitting layer to produce excitons, which transition from the excited state to the ground state, emitting light.

Such a self-light emitting display device is attracting attention as a next-generation display as meeting the high display quality requirements such as wide viewing angle, high brightness and contrast, and quick response speed, as well as having a low power consumption, a light weight, and a small thickness due to omitting the separate power source.

SUMMARY

Embodiments of the invention provide a display device having reduced color mixing between adjacent pixels and/or between adjacent sub-pixels and a method of providing the display device having the reduced color mixing.

However, embodiments are not restricted to the one set forth herein. The above and features of the invention will become more apparent to one of ordinary skill in the art to which the invention pertains by referencing the detailed description of the disclosure given below.

An embodiment of a display device includes a first display substrate including a light emitting element which emits light of a first color or light of a second color different from the first color, a second display substrate including in order toward the first display substrate, a layer including both a bank layer defining an opening and a wavelength control pattern in the opening, a capping layer covering the wavelength control pattern and the bank layer, and a color absorbing layer which corresponds to the bank layer and blocks the light of the first color and the light of the second color. The capping layer includes a first area corresponding to the color absorbing layer, the bank layer includes a second area corresponding to the color absorbing layer, and the first area of the capping layer is between the color absorbing layer and the second area of the bank layer.

An embodiment of a display device includes a substrate, a light emitting element which faces the substrate and emits blue light and green light; and in order from the substrate to the light emitting element a layer including both a bank layer defining an opening and a wavelength control pattern in the opening, a capping layer covering the wavelength control pattern and the bank layer and a color absorbing layer which corresponds to the bank layer. The color absorbing layer blocks both the blue light and the green light which is emitted from the light emitting element, and transmits red light.

An embodiment of a method of fabricating a display device includes providing a bank layer defining an opening on a substrate, providing a color control layer in the opening, providing a capping layer covering the bank layer and the color control layer, after providing the capping layer, providing a color absorbing material layer on the capping layer, and patterning the color absorbing material layer on the capping layer, to provide a color absorbing pattern corresponding to the bank layer. The capping layer includes a first area corresponding to the color absorbing pattern, the bank layer includes a second area corresponding to the color absorbing pattern, and the first area of the capping layer is between the color absorbing pattern and the second area of the bank layer.

In the display device and the method of providing the display device, color mixing between adjacent pixels and/or between adjacent sub-pixels is reduced or effectively prevented.

The effects of the present disclosure are not limited to the aforementioned effects, and various other effects are included in the present specification.

BRIEF DESCRIPTION OF THE DRAWINGS

The above and other features of the invention will become more apparent by describing in detail embodiments thereof with reference to the attached drawings, in which.

DETAILED DESCRIPTION

Figure 1:
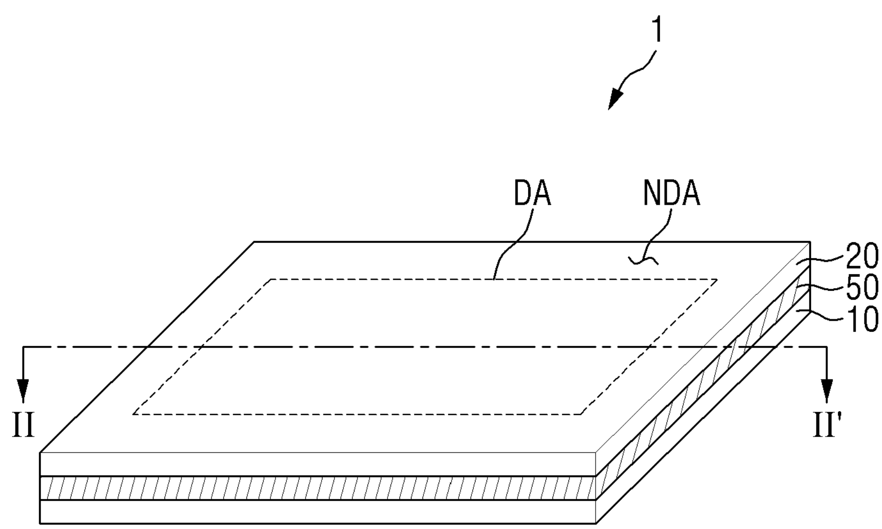
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layers are present.

Although the terms "first," "second," etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)", "second-category (or second-set)," etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described in detail with reference to the accompanying drawings.

FIG. 1 is a perspective view of an embodiment of a display device 1.

Referring to FIG. 1, a display device 1 may refer to any electronic device providing a display screen at which an image is displayed. Examples of the display device 1 may include a television, a laptop computer, a monitor, a billboard, a mobile phone, a smartphone, a tablet personal computer ("PC"), an electronic watch, a smart watch, a watch phone, a mobile communication terminal, an electronic notebook, an electronic book, a portable multimedia player ("PMP"), a navigation device, a game machine, a digital camera, an Internet-of-Things device and the like, which provide a display screen.

The display device 1 illustrated in the drawing is a television ("TV"). The display device 1 may have a high resolution or an ultra-high resolution such as high definition ("HD"), ultra-high definition ("UHD"), 4K and 8K, without being limited thereto.

The display device 1 may have a rectangular shape in a plan view. The planar shape of the display device 1 is not limited to the exemplified one, but may have a circular shape or other planar shapes.

The display device 1 may include a display area DA at which an image is displayed and a non-display area NDA at which an image is not displayed. The display area DA may include a pixel PX provided in plural including a plurality of pixels PX at which light is generated, an image is displayed, etc. The non-display area NDA is adjacent to the display area DA. In an embodiment, the non-display area NDA may be located around the display area DA and may surround the display area DA, in the plan view.

Figure 2:
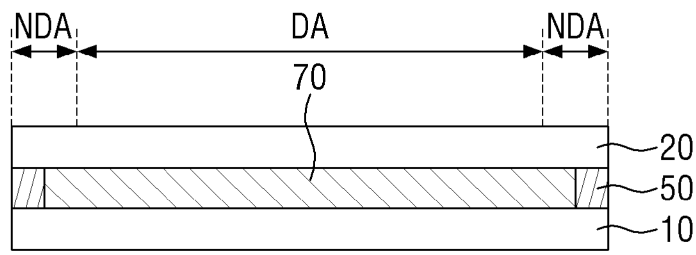
FIG. 2 is a schematic cross-sectional view taken along line II-IT of FIG. 1.

FIG. 2 is a cross-sectional view taken along line II-II' of FIG. 1.

Referring to FIG. 2, the display device 1 may include a first display substrate 10 and a second display substrate 20 facing the first display substrate 10. The display device 1 may further include a sealing member 50 that couples the first display substrate 10 to the second display substrate 20, and a filling layer 70 which fills a space between the first display substrate and the second display substrate 20.

The first display substrate 10 may include elements and circuits for generating and/or displaying an image. The first display substrate 10 may include, for example, a pixel circuit such as a switching element, a self-light emitting element, and a pixel defining layer PDL that defines an emission region EMA (e.g., light emission region) and a non-emission region NEM which is adjacent to the emission region EMA, which will be described later, in the display area DA. In an embodiment, the self-light emitting element may include at least one of an organic light emitting diode, a quantum dot light emitting diode, an inorganic micro light emitting diode (e.g., micro LED) and an inorganic nano light emitting diode (e.g., nano LED). Hereinafter, the self-light emitting element as an organic light emitting diode will be described by way of example.

The second display substrate 20 may be located above the first display substrate 10 to face the first display substrate 10. The second display substrate 20 may include a color control structure that converts the color of light incident thereto (e.g., incident light). The color control structure may control the wavelength of incident light, thereby converting the color of incident light.

The sealing member 50 may be positioned between the first display substrate 10 and the second display substrate 20, in the non-display area NDA. The sealing member 50 may be disposed along edges of the first display substrate 10 and the second display substrate 20 in the non-display area NDA, and may surround the display area DA in a plan view. The first display substrate 10 and the second display substrate 20 may be coupled to each other via the sealing member 50. The sealing member 50 may include an organic material. The sealing member 50 may include or be made of an epoxy resin, but is not limited thereto.

A filling layer 70 may be disposed in a space defined between the first display substrate and the second display substrate 20 together with the sealing member 50. The filling layer 70 may fill the space between the first display substrate 10 and the second display substrate 20. That is, the filling layer 70 may fill the space between the first display substrate 10 and the second display substrate 20, and may serve to bond the first display substrate 10 and the second display substrate 20 to each other. The filling layer 70 may include or be made of a material that can transmit light. The filling layer 70 may include an organic material. In an embodiment, for example, the filling layer 70 may include or be formed of a Si-based organic material, an epoxy-based organic material or the like, but is not limited thereto. In an embodiment, the filling layer 70 may be omitted.

Figure 3:
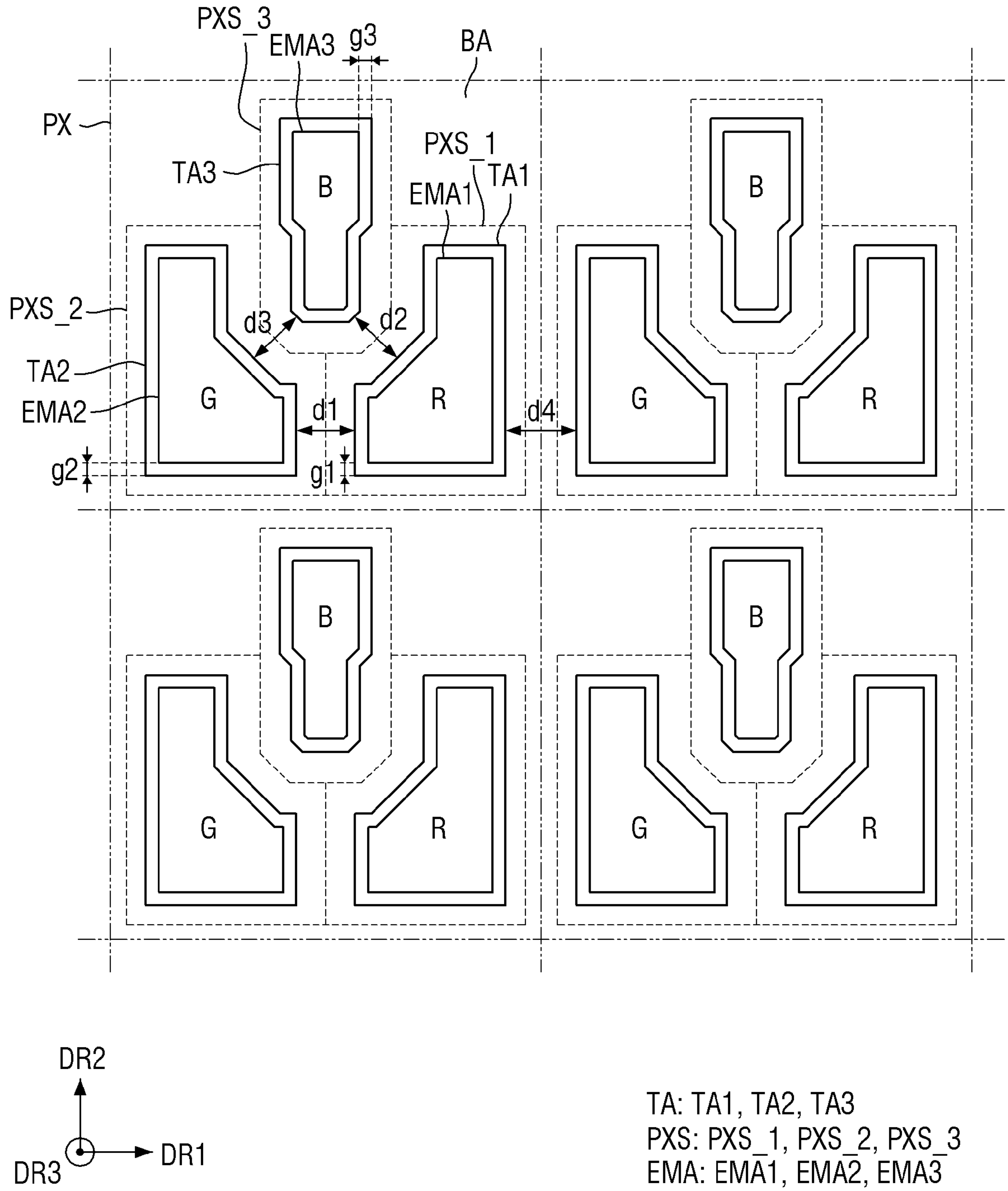
FIG. 3 is a schematic plan view showing an embodiment of a pixel arrangement of a display device.
Figure 4:
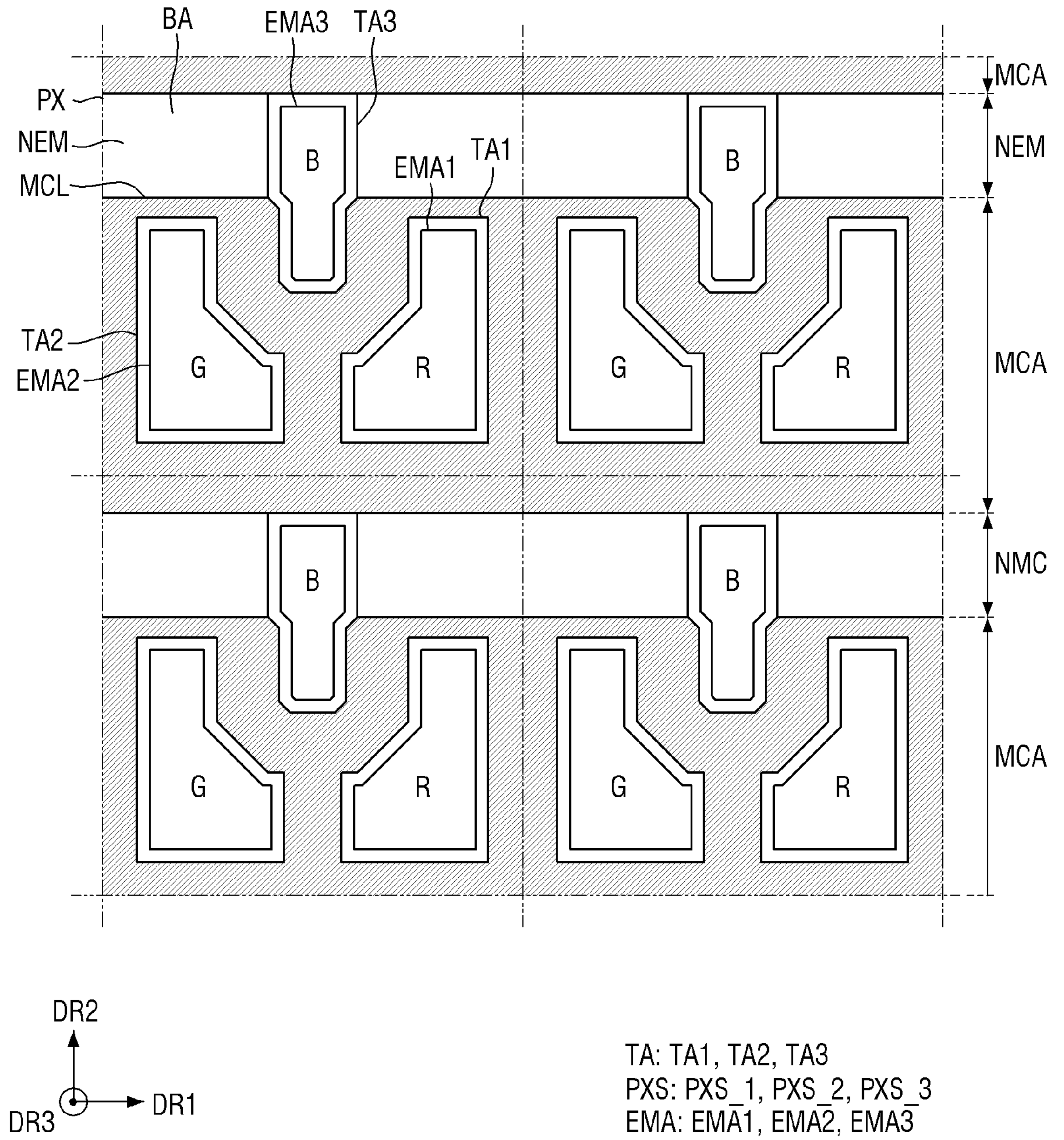
FIG. 4 is a schematic plan view showing an embodiment of a pixel arrangement relative to a color mixing prevention layer in a display device.

FIG. 3 is a schematic plan view showing an embodiment of a pixel arrangement of a display device 1. FIG. 4 is a schematic plan view showing an embodiment of a pixel arrangement relative to an arrangement of a color mixing prevention layer MCL in a display device 1. FIG. 4 shows a planar arrangement of an embodiment of a color mixing prevention layer MCL.

In FIG. 3, a first direction DR1 indicates a horizontal direction, a second direction DR2 indicates a vertical direction which intersects the first direction DR1, and a third direction DR3 indicates a thickness direction of the display device 1 (see FIG. 1) which intersects both the first direction DR1 and the second direction DR2.

Referring to FIGS. 3 and 4, the display area DA of the display device 1 includes a plurality of pixels PX. The pixel PX represents a minimum unit repeated for generation of light, display of an image, etc. In order to achieve full-color display, each pixel PX may include a plurality of sub-pixels PXS emitting different colors. In an embodiment, for example, each one of the pixels PX may include a first sub-pixel PXS_1 at which red light is emitted from the display device 1 (e.g., red light emission), a second sub-pixel PXS_2 at which green light is emitted from the display device 1 (e.g., green light emission), and a third sub-pixel PXS_3 at which blue light is emitted from the display device 1 (e.g., blue light emission). The first sub-pixel PXS_1, the second sub-pixel PXS_2 and the third sub-pixel PXS_3 may be provided in one-to-one correspondence within each of the pixels PX.

Each of the sub-pixels PXS may include a light transmission region TA and a light blocking region BA which is adjacent to the light transmission region TA. In an embodiment, the light blocking region BA may be located around the light transmission region TA and may surround the light transmission region TA, in the plan view. The light transmission region TA may be a planar area at which light emitted from the emission region EMA is transmitted to the outside of the display device 1 (see FIG. 1). In other words, light emitted from the emission region EMA is transmitted to the outside of the display device 1 (see FIG. 1) through the light transmission region TA. The light blocking region BA may be a planar area at which light emitted from the emission region EMA is not transmitted to the outside of the display device 1 (see FIG. 1). In other words, the light blocking region BA may block light emitted from the emission region EMA such that the light is not transmitted to the outside of the display device 1 through the light blocking region BA (see FIG. 1).

The light blocking region BA of one of the sub-pixels PXS is in contact with the light blocking region BA of a neighboring one of the sub-pixels PXS (regardless of whether the light blocking regions BA respectively correspond to sub-pixels PXS in a same one of the pixels PX). The light blocking regions BA of the sub-pixels PXS which are adjacent to each other, may be integrally connected to each other. Further, the light blocking regions BA of all the sub-pixels PXS may be integrally connected to each other, but is not limited thereto. The light transmission regions TA of the sub-pixels PXS which are adjacent to each other may be separated from and distinguished from each other by the light blocking region BA. The light transmission region TA and the light blocking region BA will be described in detail later.

Conceptually, the sub-pixels PXS which are adjacent to each other may be interpreted as being in contact with each other. As being in contact, a boundary is defined between the sub-pixels PXS which are adjacent to each other, such that an interface is formed therebetween (e.g., at the boundary). The boundary between the sub-pixels PXS which are adjacent to each other may be in the light blocking region BA including portions thereof which area integrally connected to each other, so that the sub-pixels PXS may not be physically distinguished from each other.

A space between is defined between the light transmission regions TA of the sub-pixels PXS which are adjacent to each other. Edges of the light transmission regions TA may be separated by a distance (e.g., along a width direction). The boundary between the sub-pixels PXS may be in an intermediate point along the width direction within the space between the light transmission regions TA of the sub-pixels PXS which are adjacent to each other. The overall planar shape of the sub-pixel PXS may be in a similar relationship to the planar shape of the light transmission region TA in a corresponding one of the sub-pixels PXS, but is not limited thereto.

The light transmission regions TA include a first light transmission region TA1, a second light transmission region TA2 and a third light transmission region TA3 (e.g., light transmission regions TA1, TA2 and TA3). The planar shapes of the light transmission regions TA of the sub-pixels PXS in each of the pixels PX may not be the same. In an embodiment, for example, the planar shape of the first light transmission region TA1 of the first sub-pixel PXS_1 may be substantially the same as the planar shape of the second light transmission region TA2 of the second sub-pixel PXS_2, but may be different from the planar shape of the third light transmission region TA3 of the third sub-pixel PXS_3, without being limited thereto. In addition, the planar shape of the first light transmission region TA1 of the first sub-pixel PXS_1 and the planar shape of the second light transmission region TA2 of the second sub-pixel PXS_2 may be symmetrical to each other in the plan view, with respect to boundary between the first sub-pixel PXS_1 and the second sub-pixel PXS_2 which are adjacent to each other.

The first light transmission region TA1 and the second light transmission region TA2 may be adjacent to each other along the first direction DR1. The third light transmission region TA3 is at a same side of both the first light transmission region TA1 and the second light transmission region TA2 along the second direction DR2. A portion of the third light transmission region TA3 may be disposed between the first light transmission region TA1 and the second light transmission region TA2 along the first direction DR1. In FIG. 3, the third light transmission region TA3 may be at the upper left side of the first light transmission region TA1 and at the upper right side of the second light transmission region TA2.

A portion of the first light transmission region TA1 may be closest and adjacent to the second light transmission region TA2 along the first direction DR1. A remaining portion of the first light transmission region TA1 which excludes the portion of the first light transmission region TA1 may be closest and adjacent to the third light transmission region TA3 along the first direction DR1. That is, the third light transmission region TA3 may be in a partial region between the first light transmission region TA1 and the second light transmission region TA2. A portion of the third light transmission region TA3 is between the first light transmission region TA1 and the second light transmission region TA2 along the first direction DR1, and a remaining portion of the third light transmission region TA3 may protrude from the first light transmission region TA1 and the second light transmission region TA2 along the second direction DR2.

Referring to FIG. 3, for example, each of the first light transmission region TA1, the second light transmission region TA2 and the third transmission region TA3 may include a lower portion and an upper portion which is further in the second direction than the lower portion. The lower portion of the first light transmission region TA1 and the lower portion of the second light transmission region TA2 may be adjacent to each other along the first direction DR1, and the upper portion of the first light transmission region TA1 and the lower portion of the second light transmission region TA2 may face each other with the lower portion of the third light transmitting region TA3 therebetween. The lower portion of the third light transmitting region TA3 may be nested within the upper portions of the first light transmission region TA1 and the second light transmission region TA2 which face each other along the first direction DR1.

The first light transmission region TA1 and the second light transmission region TA2 may be spaced apart from each other by a first distance d1. The first light transmission region TA1 and the third light transmission region TA3 may be spaced apart from each other by a second distance d2. The second light transmission region TA2 and the third light transmission region TA3 may be spaced apart from each other by a third distance d3. In addition, the first light transmission region TA1 and the second light transmission region TA2 respectively disposed in the pixels PX adjacent to each other may be spaced apart by a fourth distance d4. The distances d1, d2, d3 and d4 may respectively indicate the shortest distances between the light transmission regions TA1, TA2 and TA3. The distances d1, d2, d3 and d4 may be in the range of about 18 micrometers (μm) to about 22 μm, or may be about 20 μm. The distances d1, d2, d3 and d4 which are respectively between the light transmission regions TA1, TA2 and TA3 may all be the same, but are not limited thereto. In an embodiment, the distances d1, d2, d3 and d4 may all be different from each other, or a portion may be different from each other.

Each of the sub-pixels PXS may include the light transmission region TA and the light blocking region BA which is adjacent to the light transmission region TA, and may further include the emission region EMA and the non-emission region NEM which is adjacent to the emission region EMA. Each of the sub-pixels PXS may include a first emission region EMA1, a second emission region EMA2 and a third emission region EMA3 (e.g., emission regions EMA1, EMA2 and EMA3).

The emission regions EMA1, EMA2 and EMA3 may be disposed in the light transmission regions TA1, TA2, and TA3, respectively. That is, a planar shape of the first emission region EMA1 may be disposed in a planar shape the first transmission region TA1, a planar shape of the second emission region EMA2 may be disposed in a planar shape of the second transmission region TA2, and a planar shape of the third emission region EMA3 may be disposed in a planar shape of the third light transmission region TA3. The emission regions EMA1, EMA2 and EMA3 may entirely overlap the light transmission regions TA1, TA2 and TA3 to be nested therein, respectively, but are not limited thereto. The planar shapes of the emission regions EMA1, EMA2 and EMA3 may correspond to the planar shapes of the light transmission regions TA1, TA2 and TA3, respectively, but are not limited thereto.

An outer edge of the light transmission regions TA1, TA2 and TA3 may be spaced apart from an outer edge of the emission regions EMA1, EMA2 and EMA3 by first gap g1, second gap g2 and third gap g3, respectively, in a plan view. An entirety of the outer edge of a light transmission region TA may be spaced apart from the outer edge of an emission region EMA. In an embodiment, the entire planar area of the first emission region EMA1 is within the first light transmission region TA1, and the planar area of the first emission region EMA1 may be smaller than the planar area of the first light transmission region TA1. Therefore, the outer edge of the first light transmission region TA1 may surround the first emission region EMA1 and be spaced apart therefrom by the first gap g1 taken from the outer edge of the first emission region EMA1 in a plan view. The first gap g1 may indicate a distance between the outer edge of the first emission region EMA1 and the outer edge of the first light transmission region TA1 in a plan view. The first gap g1 may be in the range of about 3 μm to about 13 μm, or may be about 8 μm.

In the above, a description has been made of the first emission region EMA1 relative to the first light transmission region TA1, but the same description may be applied to the second emission region EMA2 relative to the second light transmission region TA2, and the third emission region EMA3 relative to the third light transmission region TA3. The distances and gaps described above may be defined in a direction normal to a respective portion of an outer edge of a light transmission region TA and/or an emission region EMA.

The pixels PX including the plurality of sub-pixels PXS may be alternately arranged in a matrix form along the display area DA. The planar shape and arrangement of the sub-pixels PXS may be the same for each of the pixels PX, but are not limited thereto. The overall planar shape of each of the pixels PX including the plurality of sub-pixels PXS may be a substantially square shape, however, is not limited thereto. In an embodiment, the planar shape of each of the pixels PX may be variously modified, such as a rhombus or a rectangle.

The color mixing prevention layer MCL may be further disposed in each of the pixels PX. The color mixing prevention layer MCL may be disposed in the light blocking region BA which is outside of each of the transmission regions TA. The color mixing prevention layer MCL may have a pattern or planar shape which is different from the light blocking region BA in a plan view. The planar area of the color mixing prevention layer MCL may be equal to or smaller than the planar area of the light blocking region BA in a plan view. An entirety of the planar area of the color mixing prevention layer MCL may correspond to or overlap the light blocking region BA.

The color mixing prevention layer MCL in a portion of each of the pixels PX. The color mixing prevention layer MCL may be disposed between the light transmission regions TA1, TA2 and TA3 within a plane defined by the first direction DR1 and the second direction DR2 which cross each other. In an embodiment, the color mixing prevention layer MCL may be selectively disposed in planar areas where the distances between the light transmission regions TA1, TA2 and TA3 are the first to fourth distances d1, d2, d3 and d4, but is not limited thereto.

Referring to FIG. 4, for example, at least first to fourth pixels are shown adjacent to each other along both the first direction DR1 and the second direction DR2. Among first and second pixels adjacent to each other along the first direction DR1, the color mixing prevention layer MCL which is in the first pixel may extend along the first direction DR1 beyond a boundary between the first and second pixels among the pixels PX, to dispose an extended portion of the color mixing prevention layer MCL in the second pixel. Although not limited to the following, the color mixing prevention layer MCL may be continuously provided along the first direction DR1. That is, the color mixing prevention layer MCL may lengthwise extend along the first direction DR1 without disconnection, across pixels PX which are arranged along the first direction DR1.

The color mixing prevention layer MCL has a width along the second direction DR2. Among first and second pixels adjacent to each other along the second direction DR2, the color mixing prevention layer MCL may extend beyond a boundary between the first and second pixels among the pixels PX, to dispose an extended portion of the color mixing prevention layer MCL in the second pixel. However, the color mixing prevention layer MCL may be disconnected along the second direction DR2 to define patterns of the color mixing prevention layer MCL which are arranged along the second direction DR2.

In other words, a region or planar area in which the color mixing prevention layer MCL is disposed may be referred to as a color mixing prevention region MCA, and a region or planar area in which the color mixing prevention layer MCL is not disposed (e.g., excluded) may be referred to as a non-color mixing prevention region NMC. In an embodiment, the color mixing prevention region MCA corresponding to the patterns of the color mixing prevention layer MCL and the non-color mixing prevention region NMC corresponding to the regions therebetween along the second direction DR2, may be repeatedly and alternately arranged along the second direction DR2 within the display area DA.

In an embodiment, within the pixel PX, the color absorbing layer (e.g., a pattern of the color mixing prevention layer MCL) partially surrounds the first light transmission region TA1, and completely surrounds both the second light transmission region TA2 and the third light transmission region TA3.

The color mixing prevention region MCA may extend from one of the pixels PX to another one of the pixels PX which is adjacent to the one of the pixels PX along the second direction DR2, beyond a boundary between the pixels PX adjacent along the second direction DR2. That is, the color mixing prevention region MCA may be disposed in a portion of one of the pixels PX, and may include an extended portion thereof disposed in a portion of another one of the pixels PX which is adjacent along the second direction DR2 to the one of the pixels PX. The non-color mixing prevention region NMC is disposed between the pixels PX adjacent to each other along the second direction DR2. The non-color mixing prevention region NMC is disposed in one of the pixels PX considering a dimension along the second direction DR2.

Since the color mixing prevention layer MCL is disposed between the light transmission regions TA1, TA2 and TA3, even if the distances between the pixels PX and between the sub-pixels PXS decrease due to an increased resolution of the display device 1, color mixing between the pixels PX and between the sub-pixels PXS may be reduced or effectively prevented. That is, the color mixing prevention layer MCL serves to suppress or effectively prevent the color mixing between the pixels PX and between the sub-pixels PXS, and may be disposed only in planar areas where the pixels PX are adjacent to each other (e.g., at boundaries between pixels PX) and where the sub-pixels PXS are adjacent to each other (e.g., distances between sub-pixels PXS). Therefore, by arranging the color mixing prevention layer MCL in only a portion of each pixel PX, reduction of the material cost and minimizing an increase in the process cost for providing a display device 1 may be reduced.

Hereinafter, a cross-sectional structure of the display device 1 (see FIG. 1) will be described.

Figure 5:
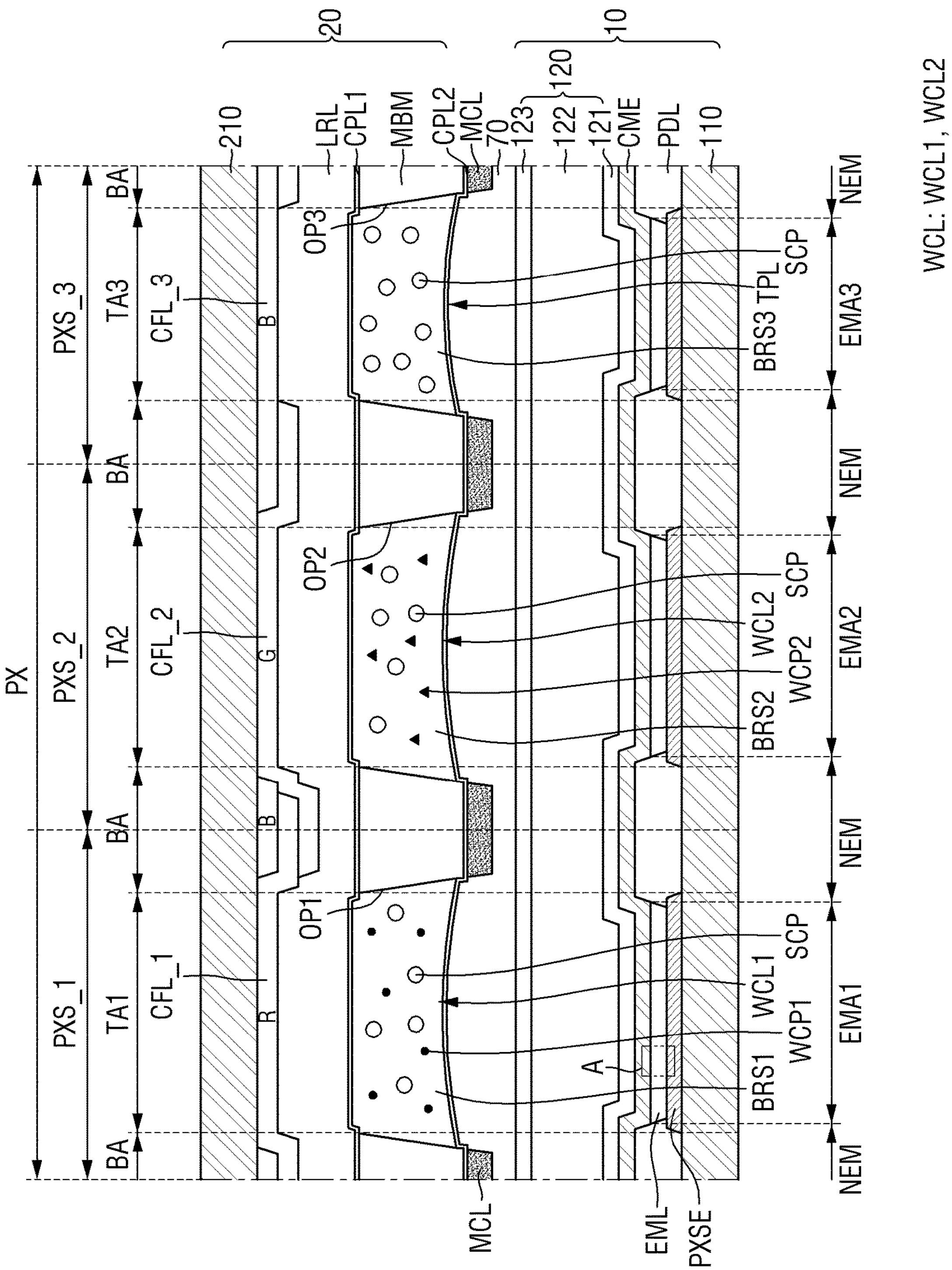
FIG. 5 is a cross-sectional view of an embodiment of a display device.

FIG. 5 is a cross-sectional view of an embodiment of a display device 1.

Referring to FIG. 5, the first display substrate 10 includes a first substrate 110 and a plurality of light emitting elements disposed on the first substrate 110.

When sequentially describing the cross-sectional structure of the first display substrate in an upward direction in FIG. 5, the first substrate 110 may be an insulating substrate. The first substrate 110 may include a transparent material. In an embodiment, for example, the first substrate 110 may include a transparent insulating material such as glass, quartz or the like. The first substrate 110 may be a rigid substrate. However, the first substrate 110 is not limited to the exemplified one. The first substrate 110 may include plastic such as polyimide or the like, and may have a flexible property so as to be twistable, bendable, foldable or rollable.

A sub-pixel electrode PXSE may be provided in plural including a plurality of sub-pixel electrodes PXSE disposed on one surface of the first substrate 110. The sub-pixel electrode PXSE may be disposed in one-to-one correspondence for each of the sub-pixels PXS. The sub-pixel electrodes PXSE of the sub-pixels PXS which are adjacent to each other may be separated from each other. That is, the sub-pixel electrodes PXSE of the sub-pixels PXS which are adjacent to each other may be defined by patterns which are spaced apart from each other in a direction along the first substrate 110 (e.g., along the plane defined by the first direction DR1 and the second direction DR2 which cross each other). A circuit layer (not shown) which drives each of the sub-pixel electrodes PXSE may be disposed between the first substrate 110 and a same layer including each of the sub-pixel electrodes PXSE. The circuit layer (not shown) may include a plurality of thin film transistors, capacitors and the like.

The sub-pixel electrode PXSE may be a first electrode, e.g., an anode electrode of the light emitting element or a light emitting diode. The sub-pixel electrode PXSE may have a stacked structure along the third direction DR3 which includes a material layer having a high work function, such as indium tin oxide ("ITO"), indium zinc oxide ("IZO"), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Jr), chromium (Cr), lithium (Li), calcium (Ca), or a combination thereof. The material layer having a high work function may be disposed above the reflective material layer and disposed closer to a light emitting layer EML than a reflective layer. The sub-pixel electrode PXSE may have a multilayer structure such as ITO/Mg, ITO/MgF, ITO/Ag and ITO/Ag/ITO, but is not limited thereto.

The pixel defining layer PDL may be disposed on one surface of the first substrate 110 and extended along the boundaries of the sub-pixels PXS. The pixel defining layer PDL may be disposed on the sub-pixel electrodes PXSE and may include or define openings which expose the sub-pixel electrodes PXSE to outside of the pixel defining layer PDL. The non-emission regions NEM and the emission regions EMA may be distinguished from each other by the pixel defining layer PDL and the openings thereof. The pixel defining layer PDL may include an organic insulating material such as acrylic resin, epoxy resin, phenolic resin, polyamide resin, polyimide resin, unsaturated polyester resin, polyphenylene resin, polyphenylenesulfide resin or benzocyclobutene ("BCB"). The pixel defining layer PDL may include an inorganic material.

The light emitting layer EML may include patterns disposed in a same layer including a plurality of light emitting layers EML respectively disposed on the sub-pixel electrodes PXSE exposed by openings of the pixel defining layer PDL. In an embodiment in which the display device 1 is an organic light emitting display, the light emitting layer EML may include an organic layer including an organic material. The organic layer may include an organic material layer, and in some cases, may further include a hole injection/transport layer and/or an electron injection/transport layer, as an auxiliary layer for assisting in light emission. In an embodiment, when the display device 1 is a micro LED display, a nano LED display or the like, the light emitting layer EML may include an inorganic material layer such as an inorganic semiconductor.

The light emitting layer EML may have a tandem structure in which a plurality of the light emitting layers EML (e.g., each including the organic material layer, the hole injection/transport layer and/or the electron injection/transport layer, or the inorganic material layer) are superposed along the thickness direction and a charge generation layer is disposed between the light emitting layers EML. The light emitting layers EML superposed may respectively emit light of the same wavelength, or may emit light of different wavelengths. In a same layer, the light emitting layer EML (e.g., light emitting pattern) of each of the sub-pixels PXS may be separated from the light emitting layer EML of a neighboring one of the sub-pixel PXS.

Figure 6:
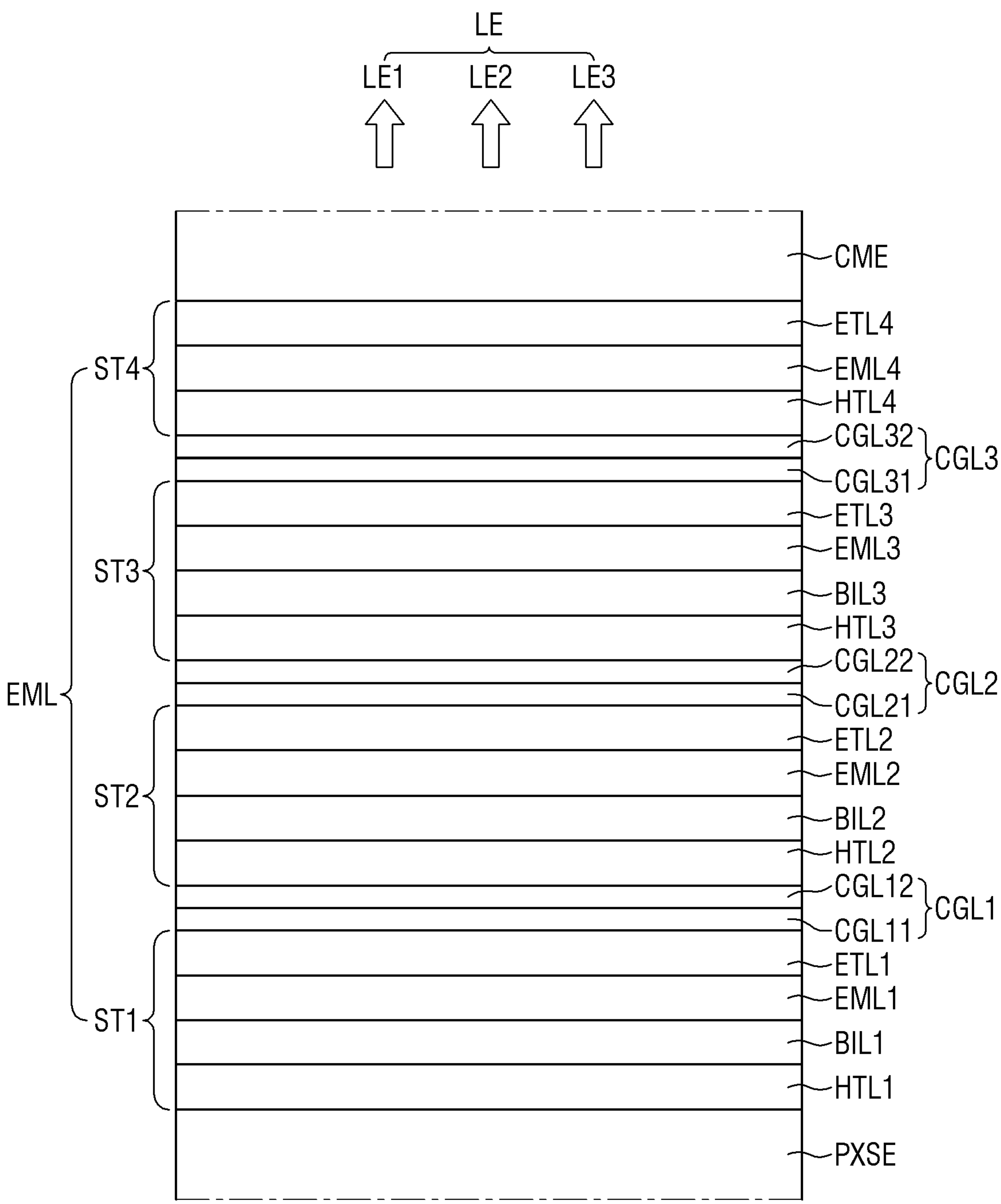
FIG. 6 is an enlarged cross-sectional view of area A of FIG. 5.

FIG. 6 is referred to for further describing the structure of the light emitting layer EML.

FIG. 6 is an enlarged cross-sectional view of an embodiment of area A of FIG. 5.

Referring further to FIG. 6, emission light LE finally emitted from the light emitting layer EML may be an emitted light in which a first component LE1 (e.g., first light component), a second component LE2 (e.g., second light component) and a third component LE3 (e.g., third light component) are mixed. In the emission light LE, the first component LE1 and the second component LE2 may each have a peak wavelength of about 440 nanometers (nm) or more and less than about 480 nm, and the third component LE3 may have a peak wavelength of about 500 nm or more and about 550 nm or less. That is, the emission light LE may be a mixed light in which blue light and green light are mixed.

The light emitting layer EML may include or be formed of a structure, e.g., a tandem structure, in which a plurality of sub-light emitting layers are superposed. In an embodiment, for example, the light emitting layer EML may collectively include a first stack ST1 including a first sub-light emitting layer EML1, a second stack ST2 including a second sub-light emitting layer EML2 and located above the first stack ST1, a third stack ST3 including a third sub-light emitting layer EML3 and located above the second stack ST2, and a fourth stack ST4 including a fourth sub-light emitting layer EML4 and located above the third stack ST3. The light emitting layer EML may further include a first charge generation layer CGL1 located between the first stack ST1 and the second stack ST2, a second charge generation layer CGL2 located between the second stack ST2 and the third stack ST3, and a third charge generation layer CGL3 located between the third stack ST3 and the fourth stack ST4. The first stack ST1, the second stack ST2, the third stack ST3 and the fourth stack ST4 may be disposed in order along the third direction DR3 to overlap each other. The first sub-light emitting layer EML1, the second sub-light emitting layer EML2, the third sub-light emitting layer EML3 and the fourth sub-light emitting layer EML4 may be disposed in order along the third direction DR3 to overlap each other.

At least one of the first sub-light emitting layer EML1, the second sub-light emitting layer EML2, the third sub-light emitting layer EML3 and the fourth sub-light emitting layer EML4 may emit green light, and remaining sub-light emitting layers may emit blue light. In addition, the remaining sub-light emitting layers that emit blue light may emit blue light having different peak wavelength ranges from each other. Although not limited to the following, for example, the first sub-light emitting layer EML1, the second sub-light emitting layer EML2 and the third sub-light emitting layer EML3 may emit blue light and the fourth sub-light emitting layer EML4 may emit green light. In addition, the first sub-light emitting layer EML1, the second sub-light emitting layer EML2 and the third sub-light emitting layer EML3 may emit blue light having different peak wavelength ranges from each other. That is, the first stack ST1, the second stack ST2 and the third stack ST3 may generate and/or emit blue light and the fourth stack ST4 may generate and/or emit green light.

In an embodiment, the first sub-light emitting layer EML1, the second sub-light emitting layer EML2 and the third sub-light emitting layer EML3 include the same material as each other, and a method of adjusting a resonance distance may be used. Alternatively, in order to emit blue light in different wavelength ranges, at least one of the first sub-light emitting layer EML1, the second sub-light emitting layer EML2 and the third sub-light emitting layer EML3, and at least another one among the first sub-light emitting layer EML1, the second sub-light emitting layer EML2 and the third sub-light emitting layer EML3 may include different materials from each other.

That is, the emission light LE finally emitted from the light emitting layer EML may be a mixed light in which the first component LE1, the second component LE2 and the third component LE3 are mixed. In an embodiment, the first component LE1 may be first blue light having a first peak wavelength, the second component LE2 may be second blue light having a second peak wavelength and the third component LE3 may be green light.

One of the first peak wavelength and the second peak wavelength may be in a range of about 440 nm or more and less than 460 nm, and the other one thereof may be in a range of 460 nm or more and 480 nm or less. A peak wavelength of the green light may be in a range of 500 nm or more and 550 nm or less. However, the ranges of the peak wavelengths are not limited thereto. One of the first blue light and the second blue light may be deep blue color, and the other one thereof may be sky blue color.

The emission light LE emitted from the light emitting layer EML is a mixed light of blue light and green light, and includes a long wavelength component and a short wavelength component. Therefore, ultimately, the light emitting layer EML may emit blue light having an emission peak in a broader wavelength range as the emission light LE, thereby improving the color visibility at a side viewing angle of the display device 1. In addition, since the third component LE3 of the emission light LE is green light, the green light component of the light provided from the display device 1 to outside of the light emitting layer EML may be supplemented, thereby improving the color reproducibility of the display device 1.

In an embodiment the first sub-light emitting layer EML1, the second sub-light emitting layer EML2 and the third sub-light emitting layer EML3 may emit blue light having the same peak wavelength range as each other, or the first sub-light emitting layer EML1, the second sub-light emitting layer EML2, the third sub-light emitting layer EML3 and the fourth sub-light emitting layer EML4 may all emit blue light.

The light emitting layer EML may not emit red light. That is, the emission light LE may not include (e.g., exclude) a light component having a peak wavelength in a range of 610 nm to about 650 nm.

The first sub-light emitting layer EML1, the second sub-light emitting layer EML2, the third sub-light emitting layer EML3 and the fourth sub-light emitting layer EML4 may each include a host and a dopant. A material of the host is not particularly limited. In an embodiment, for example, tris(8-hydroxyquinolinato)aluminium (Alq3), 4,4'-bis(N-carbazolyl)-1,1'-biphenyl ("CBP"), poly(n-vinylcarbazole) ("PVK"), 9,10-di(naphthalene-2-yl)anthracene (" "nd"), 4,4',4"-Tris(carbazol-9-yl)-triphenylamine ("TCTA"), 1,3,5-tris(N-phenylbenzimidazole-2-yl)benzene ("TPBi"), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), or 2-methyl-9,10-bis(naphthalen-2-yl) anthracene ("MADN", and the like may be used for light emitting layer material.

Each sub-light emitting layer that emits blue light may include a fluorescent material including any one selected from spiro-DPVBi, spiro-6P, distyryl-benzene ("DSB"), distyrylarylene ("DSA"), a polyfluorene ("PFO")-based polymer, and a poly(p-phenylene vinylene) ("PPV")-based polymer. In an embodiment, a phosphorescent material including an organometallic complex such as (4,6-F2ppy) 2Irpic may be included for the blue light-emitting layers.

The respective light emitting layer that emits green light may include a fluorescent material including, for example, tris(8-hydroxyquinolinato)aluminium(III) (Alq3), or a phosphorescent material such as fac tris(2-phenylpyridine) iridium (Ir(ppy)3), bis(2-phenylpyridine)(acetylacetonate) iridium(III) (Ir(ppy)2(acac)), or 2-phenyl-4-methyl-pyridine iridium (Ir(mpyp)3).

The first stack ST1 may be positioned on the sub-pixel electrode PXSE and may further include a first hole transport layer HTL1, a first electron blocking layer BIL1 and a first electron transport layer ETL1 in order from the sub-pixel electrode PXSE.

The first hole transport layer HTL1 may be positioned on the sub-pixel electrode PXSE. The first hole transport layer HTL1 serves to facilitate the transport of holes and may include a hole transport material.

The first electron blocking layer BIL1 may be positioned on the first hole transport layer HTL1, and between the first hole transport layer HTL1 and the first light emitting layer EML1. That is, a hole transport layer may face a sub-light emitting layer with an electron blocking layer therebetween. The first electron blocking layer BIL1 may include a hole transport material and a metal or metal material to reduce or effectively prevent movement of electrons generated in the first light emitting layer EML1 into the first hole transport layer HTL1. In an embodiment, the first hole transport layer HTL1 and the first electron blocking layer BIL1 described above may also be provided or formed of a single layer in which respective materials are combined.

The first electron transport layer ETL1 may be positioned on the first sub-light emitting layer EML1, and between the first charge generation layer CGL1 and the first sub-light emitting layer EML1. The first electron transport layer ETL1 may include an electron transport material.

The first charge generation layer CGL1 may be disposed on the first stack ST1. The first charge generation layer CGL1 may be positioned between the first stack ST1 and the second stack ST2. The first charge generation layer CGL1 may serve to allow electric charges to be injected into each sub-light emitting layer. The first charge generation layer CGL1 may serve to control an electrical charge balance between the first stack ST1 and the second stack ST2. The first charge generation layer CGL1 may include a first n-type charge generation layer CGL11 and a first p-type charge generation layer CGL12. The first p-type charge generation layer CGL12 may be disposed on the first n-type charge generation layer CGL11, and between the first n-type charge generation layer CGL11 and the second stack ST2.

The first charge generation layer CGL1 may have a structure in which the first n-type charge generation layer CGL11 and the first p-type charge generation layer CGL12 are in contact with each other, such as to form an interface therebetween. The first n-type charge generation layer CGL11 is disposed closer to the sub-pixel electrode PXSE than the first p-type charge generation layer CGL12, in order between the sub-pixel electrode PXSE and a common electrode CME. The first p-type charge generation layer CGL12 is disposed closer to the common electrode CME than the first n-type charge generation layer CGL11, between the sub-pixel electrode PXSE and the common electrode CME of the light emitting layer EML. The first n-type charge generation layer CGL11 supplies electrons to the first sub-light emitting layer EML1 adjacent to the sub-pixel electrode PXSE, and the first p-type charge generation layer CGL12 supplies holes to the second sub-light emitting layer EML2 included in the second stack ST2. The first charge generation layer CGL1 is disposed between the first stack ST1 and the second stack ST2 to provide electric charges to each sub-light emitting layer, thereby increasing light emission efficiency and decreasing a driving electrical voltage.

The second stack ST2 may be positioned on the first charge generation layer CGL1, and further include a second hole transport layer HTL2, a second electron blocking layer BIL2 and a second electron transport layer ETL2 in order.

The second hole transport layer HTL2 may be positioned on the first charge generation layer CGL1. The second hole transport layer HTL2 may include or be made of the same material as the first hole transport layer HTL1, or may include one or more materials selected from materials included in the first hole transport layer HTL1. The second hole transport layer HTL2 may include or be formed of a single layer or a plurality of layers.

The second electron blocking layer BIL2 may be positioned on the second hole transport layer HTL2, and between the second hole transport layer HTL2 and the second sub-light emitting layer EML2. The second electron blocking layer BIL2 may be formed of the same material and the same structure as the first electron blocking layer BILL or may include one or more materials selected from examples of materials included in the first electron blocking layer BIL1.

The second electron transport layer ETL2 may be positioned on the second sub-light emitting layer EML2, and between the second charge generation layer CGL2 and the second sub-light emitting layer EML2. The second electron transport layer ETL2 may include or be formed of the same material and the same structure as the first electron transport layer ETL1, or may include one or more materials selected from materials included in the first electron transport layer ETL1. The second electron transport layer ETL2 may include or be formed of a single layer or a plurality of layers.

The second charge generation layer CGL2 may be positioned on the second stack ST2 and between the second stack ST2 and the third stack ST3.

The second charge generation layer CGL2 may have the same structure as the first charge generation layer CGL1 described above. In an embodiment, for example, the second charge generation layer CGL2 may include a second n-type charge generation layer CGL21 disposed closer to the second stack ST2 and a second p-type charge generation layer CGL22 disposed closer to the common electrode CME, from among the second n-type charge generation layer CGL21 and the second p-type charge generation layer CGL22. The second p-type charge generation layer CGL22 may be disposed on the second n-type charge generation layer CGL21.

The second charge generation layer CGL2 may have a structure in which the second n-type charge generation layer CGL21 and the second p-type charge generation layer CGL22 are in contact with each other. The first charge generation layer CGL1 and the second charge generation layer CGL2 may include or be made of different materials, or may include or be made of the same material.

The third stack ST3 may be positioned on the second charge generation layer CGL2, and may further include a third hole transport layer HTL3, a third electron blocking layer BIL3 and a third electron transport layer ETL3 in order.

The third hole transport layer HTL3 may be positioned on the second charge generation layer CGL2. The third hole transport layer HTL3 may include or be made of the same material as the first hole transport layer HTL1, or may include one or more materials selected from materials included in the first hole transport layer HTL1. The third hole transport layer HTL3 may include or be formed of a single layer or a plurality of layers.

The third electron blocking layer BIL3 may be positioned on the third hole transport layer HTL3, and between the third hole transport layer HTL3 and the third sub-light emitting layer EML3. The third electron blocking layer BIL3 may include or be formed of the same material and the same structure as the first electron blocking layer BILL or may include one or more materials selected from materials included in the first electron blocking layer BILL The third electron transport layer ETL3 may be positioned on the third sub-light emitting layer EML3, and between the third charge generation layer CGL3 and the third sub-light emitting layer EML3. The third electron transport layer ETL3 may include or be formed of the same material and the same structure as the first electron transport layer ETL1, or may include one or more materials selected from materials included in the first electron transport layer ETL1. The third electron transport layer ETL3 may include or be formed of a single layer or a plurality of layers.

The third charge generation layer CGL3 may be positioned on the third stack ST3 and between the third stack ST3 and the fourth stack ST4.

The third charge generation layer CGL3 may have the same structure as the first charge generation layer CGL1 described above. In an embodiment, for example, the third charge generation layer CGL3 may include a third n-type charge generation layer CGL31 disposed closer to the third stack ST3 and a third p-type charge generation layer CGL32 disposed closer to the common electrode CME, from among the third n-type charge generation layer CGL31 and the third p-type charge generation layer CGL32. The third p-type charge generation layer CGL32 may be disposed on the third n-type charge generation layer CGL31.

The third charge generation layer CGL3 may have a structure in which the third n-type charge generation layer CGL31 and the third p-type charge generation layer CGL32 are in contact with each other. The first charge generation layer CGL1 and the third charge generation layer CGL3 may include or be made of different materials or may include or be made of the same material.

The fourth stack ST4 may be positioned on the third charge generation layer CGL3, and may further include a fourth hole transport layer HTL4 and a fourth electron transport layer ETL4 in order.

The fourth hole transport layer HTL4 may be positioned on the third charge generation layer CGL3. The fourth hole transport layer HTL4 may include or be made of the same material as the first hole transport layer HTL1, or may include one or more materials selected from materials included in the first hole transport layer HTL1. The fourth hole transport layer HTL4 may include or be formed of a single layer or a plurality of layers. When the fourth hole transport layer HTL4 includes or is formed of a plurality of layers, each layer may include a different material.

The fourth electron transport layer ETL4 may be positioned on the fourth sub-light emitting layer EML4, and between the common electrode CME and the fourth light emitting layer EML4. The fourth electron transport layer ETL4 may include or be formed of the same material and the same structure as the first electron transport layer ETL1, or may include one or more materials selected from materials included in the first electron transport layer ETL1. The fourth electron transport layer ETL4 may include or be formed of a single layer or a plurality of layers. When the fourth electron transport layer ETL4 includes or is formed of a plurality of layers, each layer may include a different material.

Although not shown in the drawing, a hole injection layer may be further disposed at a position between the first stack ST1 and the sub-pixel electrode PXSE, between the second stack ST2 and the first charge generation layer CGL1, between the third stack ST3 and the second charge generation layer CGL2, and/or between the fourth stack ST4 and the third charge generation layer CGL3. The hole injection layer may serve to allow holes to be more smoothly injected into the first sub-light emitting layer EML1, the second sub-light emitting layer EML2, the third sub-light emitting layer EML3, and the fourth sub-light emitting layer EML4.

Although not shown in the drawing, an electron injection layer may be further disposed between the fourth electron transport layer ETL4 and the common electrode CME, between the third charge generation layer CGL3 and the third stack ST3, between the second charge generation layer CGL2 and the second stack ST2, and/or between the first charge generation layer CGL1 and the first stack ST1.

In the above, the light emitting layer EML has been described as including the first to fourth sub-light emitting layers EML1, EML2, EML3 and EML4, but is not limited thereto. In an embodiment, the light emitting layer EML may include the first to third sub-light emitting layers EML1, EML2 and EML3, and all of the first to third sub-light emitting layers EML1, EML2 and EML3 may emit blue light.

The wavelength of light emitted from the light emitting layer EML for each of the sub-pixels PXS may be the same for each of the sub-pixels PXS. In an embodiment, for example, the light emitting layer EML of each of the sub-pixels PXS may emit ultraviolet light or a mixed light in which blue light and green light are mixed. The light emitting from the light emitting layer EML may be incident to a color control structure. The color control structure may include a wavelength conversion pattern WCL to display a color for each of the sub-pixels PXS.

In an embodiment, the wavelength of light emitted from the light emitting layer EML for each of the sub-pixel PXS may be different for each of the sub-pixels PXS. In an embodiment, for example, the light emitting layer EML of the first sub-pixel PXS_1 may emit light of a first color, the light emitting layer EML of the second sub-pixel PXS_2 may emit light of a second color, and the light emitting layer EML of the third sub-pixel PXS_3 may emit light of a third color.

The common electrode CME may be disposed on the sub-light emitting layers. The common electrode CME may be in contact with the respective sub-light emitting layer as well as the top surface of the pixel defining layer PDL.

The common electrode CME may be continuous across the sub-pixels PXS. The common electrode CME may be a full surface electrode disposed over an entirety of the first substrate 110 without distinguishing the sub-pixels PXS. The common electrode CME may be a second electrode (e.g., a cathode electrode) of a light emitting diode.

The common electrode CME may include a material layer having a low work function, such as Li, Ca, LiF/Ca, LiF/Al, Al, Mg, Ag, Pt, Pd, Ni, Au Nd, Ir, Cr, BaF, Ba or a combination thereof (e.g., a combination of Ag and Mg). The common electrode CME may further include a transparent metal oxide layer disposed on the material layer having a low work function.

The sub-pixel electrode PXSE, the light emitting layer EML and the common electrode CME may constitute a light emitting element (e.g., an organic light emitting element). Light emitted from the light emitting layer EML may be emitted upward through the common electrode CME.

A thin film encapsulation structure 120 (e.g., encapsulation layer) may be disposed on the common electrode CME. The thin film encapsulation structure 120 may include at least one thin film encapsulation layer. In an embodiment, for example, the thin film encapsulation layer may include a first inorganic film 121 (e.g., first inorganic layer), an organic film 122 (e.g., an organic layer), and a second inorganic film 123 (e.g., second inorganic layer). Each of the first inorganic film 121 and the second inorganic film 123 may include silicon nitride, silicon oxide, silicon oxynitride or the like. The organic film 122 may include an organic insulating material such as acrylic resin, epoxy resin, phenolic resin, polyamide resin, polyimide resin, unsaturated polyester resin, polyphenylene resin, polyphenylenesulfide resin or benzocyclobutene ("BCB").

The second display substrate 20 may be disposed above the thin film encapsulation structure 120 to face the thin film encapsulation structure 120. When sequentially describing the cross-sectional structure of the second display substrate 20 in a downward direction in FIG. 5, a second substrate 210 of the second display substrate 20 may include a transparent material. The second substrate 210 may include a transparent insulating material such as glass, quartz or the like. The second substrate 210 may be a rigid substrate. However, the second substrate 210 is not limited to the exemplified one. The second substrate 210 may include plastic such as polyimide or the like, and may have a flexible property to be twistable, bendable, foldable or rollable.

The second substrate 210 may have the same substrate as the first substrate 110, but may have a different material, thickness, transmittance and the like. In an embodiment, for example, the second substrate 210 may have a higher transmittance than the first substrate 110. The second substrate 210 may be thicker or thinner than the first substrate 110.

Color filter layers CFL (e.g., color filter patterns) may be disposed on one surface of the second substrate 210. Each of the color filter layers CFL may include a colorant such as a dyes or a pigment that absorbs wavelengths of light other than the color wavelength corresponding to a sub-pixel. The color filter layers CFL may serve to block the emission of light of a color other than the corresponding color of each of the sub-pixels PXS. That is, the color filter layers CFL may selectively transmit light having a color.

The color filter layers CFL may include a first color filter layer CFL_1 (e.g., first color filter pattern), a second color filter layer CFL_2 (e.g., second color filter pattern), and a third color filter layer CFL_3 (e.g., third color filter pattern). The first color filter layer CFL_1 may be a red color filter layer, the second color filter layer CFL_2 may be a green color filter layer, and the third color filter layer CFL_3 may be a blue color filter layer. That is, the first color filter layer CFL_1 may selectively transmit red light, the second color filter layer CFL_2 may selectively transmit green light, and the third color filter layer CFL_3 may selectively transmit blue light.

The first color filter layer CFL_1 may be disposed in the first sub-pixel PXS_1, the second color filter layer CFL_2 may be disposed in the second sub-pixel PXS_2, and the third color filter layer CFL_3 may be disposed in the third sub-pixel PXS_3. The first color filter layer CFL_1, the second color filter layer CFL_2, and the third color filter layer CFL_3 may extend from a transmission area TA to define an extended portion thereof in the light blocking region BA. In other words, any one of the first color filter layer CFL_1, the second color filter layer CFL_2 and the third color filter layer CFL_3 may be disposed in the light transmission region TA of one of the pixels PX. In addition, the third color filter layer CFL_3 may be disposed in the light blocking region BA of one of the pixels PX, and at least one of the first color filter layer CFL_1 and the second color filter layer CFL_2 may be further disposed therein.

Although not limited to the following, for example, the third color filter layer CFL_3 may be disposed in the light blocking region BA, and the first color filter layer CFL_1, the second color filter layer CFL_2, or both of the first and second color filter layers CFL_1 and CFL_2 may be disposed on the third color filter layer CFL_3 in a portion of the light blocking region BA. Referring to FIG. 5, for example, when the first and second color filter layers CFL_1 and CFL_2 are disposed on the third color filter layer CFL_3 in a portion of the light blocking region BA, the first color filter layer CFL_1 overlaps the second color filter layer CFL_2 at an upper portion of light blocking region BA, but are not limited thereto, and the two portions may not overlap each other in the upper portion.

The first color filter layer CFL_1 may be disposed in or corresponding to the first light transmission region TA1, the second color filter layer CFL_2 may be disposed in the second light transmission region TA2, and the third color filter layer CFL_3 may be disposed in the third light transmission region TA3.

Since respective portions of the first color filter layer CFL_1, the second color filter layer CFL_2 and the third color filter layer CFL_3 are disposed in the light blocking region BA, light emission from the display device 1 may be blocked at the upper portion, and reflection of external light may be suppressed. Each of the color filter layers CFL blocks the emission of light of a color other than the corresponding color of each of the sub-pixels PXS. Accordingly, transmissions of, red, green and blue light may all be blocked in the light blocking region BA.

In an embodiment, an upper light absorbing member (not shown) may be disposed on the second substrate 210. The upper light absorbing member (not shown) may overlap or correspond to the pixel defining layer PDL of the first display substrate 10 and be positioned in the non-emission region NEM. The upper light absorbing member (not shown) may include a light absorbing material that absorbs a visible light wavelength band. In an embodiment, for example, the upper light absorbing member (not shown) may include or be made of a material used as a black matrix of the display device 1. The upper light absorbing member (not shown) may be a type of light blocking member.

A low refractive layer LRL may be disposed on the color filter layers CFL. The low refractive layer LRL may be disposed in both the light transmission region TA and the light blocking region BA. The low refractive layer LRL may have a lower refractive index than a color control layer WCL and TPL. In an embodiment, for example, the low refractive layer LRL may have a refractive index of about 1.1 or more and about 1.4 or less.

The low refractive layer LRL may reflect a portion of the light emitted toward the second substrate 210 from the color control layer WCL and TPL back to the color control layer WCL and TPL. That is, the low refractive layer LRL may recycle at least a portion of the light that is emitted toward the second substrate 210 through the color control layer WCL and TPL, thereby improving light utilization efficiency, and as a result, the light efficiency of the display device 1 can be improved.

The low refractive layer LRL may include an organic material, and may include particles dispersed therein. The particles included in the low refractive layer LRL may be at least any one of zinc oxide (ZnO) particles, titanium dioxide ($TiO_2$) particles, hollow silica particles, non-hollow silica particles, nano silicate particles, and porogen particles.

When the low refractive layer LRL includes or is made of an organic layer, a bottom surface which is furthest from the second substrate 210 may be flat despite a stepped portion of the upper surface opposite to the top surface. The low refractive layer LRL may completely cover bottom surfaces of the color filter layers CFL. Despite the height difference between the color filter layers CFL disposed in the light transmission region TA and the color filter layers CFL disposed in the light blocking region BA, the bottom surface of the low refractive layer LRL may be substantially flat.

A first capping layer CPL1 may be disposed on the low refractive layer LRL. The first capping layer CPL1 may reduce or effectively prevent impurities such as moisture or air from permeating from the outside and damaging or contaminating the color filter layers CFL and/or the low refractive layer LRL. Further, the first capping layer CPL1 may reduce or effectively prevent the colorants of the color filter layers CFL from being diffused into other components or layers.

The first capping layer CPL1 may directly contact one surface (the bottom surface in FIG. 5) of the low refractive layer LRL. The first capping layer CPL1 may include or be made of an inorganic material. In an embodiment, for example, the first capping layer CPL1 may include silicon nitride, aluminum nitride, zirconium nitride, titanium nitride, hafnium nitride, tantalum nitride, silicon oxide, aluminum oxide, titanium oxide, tin oxide, silicon oxynitride, or the like.

A bank layer MBM is disposed on the first capping layer CPL1. The bank layer MBM may include an organic material. The bank layer MBM may include a light absorbing material that absorbs light in a visible wavelength band. In an embodiment, the bank layer MBM may include an organic light blocking material. The bank layer MBM may be a type of light blocking member. The bank layer MBM is disposed along the boundaries of the sub-pixels PXS within a pixel PX, and each of the sub-pixels PXS may be distinguished from each other by portions of the bank layer MBM.

The bank layer MBM may define the light blocking region BA and the light transmission region TA. The planar area where the bank layer MBM is disposed corresponds to the light blocking region BA. The color control layer WCL and TPL that is not covered by the bank layer MBM or is exposed by the bank layer MBM to outside thereof, may correspond to the light transmission region TA. The bank layer MBM includes or is made of a material capable of blocking light transmission, and serves to reduce or effectively prevent light from invading into sub-pixels PXS which are adjacent to each other and causing the color mixing. In addition, in the process of providing or forming the color control layer WCL and TPL to be described later, when the color control layer WCL and TPL is provided or formed by a method such as an inkjet process, the bank layer MBM may serve as a partition wall that guides an ink material to be injected stably to a position in a direction along the second substrate 210.

The bank layer MBM may include a plurality of holes penetrating the bank layer MBM along the thickness direction. The plurality of holes may be spaced apart from each other in a direction along the second substrate 210. The color control layer WCL and TPL or a spacer (not shown) may be disposed in the plurality of holes. Hereinafter, for simplicity of description, a hole in which the color control layer WCL and TPL is disposed is referred to as an opening, and a hole in which the spacer is disposed is referred to as a through hole.

The bank layer MBM may define the opening in plural including openings OP1, OP2 and OP3 (e.g., first opening, second opening and third opening) that partially exposes the first capping layer CPL1 to outside the bank layer MBM. The openings OP1, OP2 and OP3 is disposed in the light transmission region TA and may be aligned with the light transmission region TA along the thickness direction. The openings OP1, OP2 and OP3 may overlap the color filter layers CFL along the thickness direction. The color filter layers CFL respectively overlapping the openings OP1, OP2 and OP3 may be any one of the first color filter layer CFL_1, the second color filter layer CFL_2 and the third color filter layer CFL_3. That is, the openings OP1, OP2 and OP3 defined by the bank layer MBM may be provided in plural number, and each of the plurality of openings OP1, OP2 and OP3 may overlap or be aligned with any one of the first color filter layer CFL_1, the second color filter layer CFL_2 and the third color filter layer CFL_3.

The bank layer MBM may protrude further than the color control layer WCL and TPL along the thickness direction, to define a protruded portion but is not limited thereto. The height (or thickness) of the protruded portion of the bank layer MBM relative to a pattern of the wavelength conversion layer WCL or the light transmitting layer TPL may be about 1 micrometer (μm) to about 3 μm, about 1.4 μm to about 1.8 μm, or about 1.6 μm. However, the embodiment is not limited thereto.

The color control layer WCL and TPL (or a wavelength control pattern) are respectively disposed in the openings OP1, OP2 and OP3 defined by the bank layer MBM. The color control layer WCL and TPL may include the wavelength conversion layer WCL that converts the wavelength of the incident light and/or a light transmitting layer TPL that maintains the wavelength of the incident light passing therethrough. The patterns of the wavelength conversion layer WCL or the light transmitting layer TPL may be disposed to be separated from each other for each of the sub-pixels PXS. The wavelength conversion layer WCL or the light transmitting layer TPL may overlap the emission region EMA and the light transmission region TA along the thickness direction. The wavelength conversion layer WCL or the light transmitting layer TPL which are adjacent to each other may be spaced apart from each other. The separation space may generally overlap the light blocking region BA.

The wavelength conversion layer WCL may be disposed in the sub-pixels PXS in which the wavelength of light incident from the light emitting layer EML is converted due to the difference from the color of the sub-pixel PXS corresponding thereto. The light transmitting layer TPL may be disposed in the sub-pixel PXS in which the wavelength of light incident from the light emitting layer EML is the same as the color of the sub-pixel PXS corresponding thereto. FIG. 5 illustrates the light emitting layer EML of each of the sub-pixels PXS emits a third color, and shows the wavelength conversion layer WCL is disposed in the first sub-pixel PXS_1 and the second sub-pixel PXS_2 while the light transmitting layer TPL is disposed in the third sub-pixel PXS_3. In an embodiment, when the light emitting layer EML of each of the sub-pixels PXS emits light, such as ultraviolet light, having a wavelength different from the color of each of the sub-pixels PXS, only the wavelength conversion layer WCL may be provided while the light transmitting layer TPL is omitted. In an embodiment, when the light emitting layer EML of each of the sub-pixels PXS emits light corresponding to the color of each of the sub-pixels PXS, only the light transmitting layer TPL may be provided while the wavelength conversion layer WCL is omitted, or the light transmitting layer TPL may be omitted in all of the sub-pixels PXS.

Referring again to FIG. 5, the wavelength conversion layer WCL may include a first wavelength conversion pattern WCL1 disposed in the first sub-pixel PXS_1 and a second wavelength conversion pattern WCL2 disposed in the second sub-pixel PXS_2 (e.g., wavelength conversion patterns WCL1 and WCL2).

The first wavelength conversion pattern WCL1 may include a first base resin BRS1 and a first wavelength conversion material WCP1 which is provided in the first base resin BRS1. The second wavelength conversion pattern WCL2 may include a second base resin BRS2 and a second wavelength conversion material WCP2 which is provided in the second base resin BRS2. The light transmitting layer TPL may include a third base resin BRS3 and a light scattering material SCP (e.g., scatterers SCP) provided in the third base resin BRS3.

The first to third base resins BRS1, BRS2 and BRS3 may include a light-transmitting organic material. In an embodiment, for example, the first to third base resins BRS1, BRS2 and BRS3 may include an epoxy resin, an acrylic resin, a cardo resin, an imide resin or the like. The first to third base resins BRS1, BRS2 and BRS3 may include or be formed of the same material, but is not limited thereto.

The scatterers SCP may include metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first wavelength conversion material WCP1 may convert blue light into red light, and the second wavelength conversion material WCP2 may convert blue light into green light. The first wavelength conversion material WCP1 and the second wavelength conversion material WCP2 may be quantum dots, quantum bars, phosphors or the like. Examples of the quantum dots may include group IV nanocrystals, group II-VI compound nanocrystals, group III-V compound nanocrystals, group IV-VI nanocrystals, and combinations thereof. The first wavelength conversion pattern WCL1 and the second wavelength conversion pattern WCL2 may further include scatterers SCP for increasing wavelength conversion efficiency.

The light transmitting layer TPL disposed in the third sub-pixel PXS_3 transmits blue light incident from the light emitting layer EML while maintaining the wavelength thereof. The scatterers SCP of the light transmitting layer TPL may scatter the light incident from the light emitting layer EML, and serve to control an emission angle of the light emitted through the light transmitting layer TPL. The light transmitting layer TPL may not include a wavelength conversion material.

A second capping layer CPL2 is disposed on the wavelength conversion layer WCL and the light transmitting layer TPL. The second capping layer CPL2 faces the first capping layer CPL1 with the wavelength conversion layer WCL, the light transmitting layer TPL and the bank layer MBM therebetween. The second capping layer CPL2 may include or be formed of an inorganic material. The second capping layer CPL2 may include a material selected from the above-mentioned materials of the first capping layer CPL1. The second capping layer CPL2 and the first capping layer CPL1 may include or be made of the same material, but are not limited thereto.

The second capping layer CPL2 may cover the wavelength conversion patterns WCL1 and WCL2, the light transmitting layer TPL and the bank layer MBM. The second capping layer CPL2 may cover a bottom surface of each of the wavelength conversion patterns WCL1 and WCL2 and the light transmitting layer TPL. The second capping layer CPL2 may cover not only the bottom surface of the bank layer MBM but also a side surface thereof which protrudes from the wavelength conversion patterns WCL1 and WCL2 and the light transmitting layer TPL. The second capping layer CPL2 may have a conformal shape with respect to the surface height difference defined or formed by the color control layer WCL and TPL and the bank layer MBM relative to each other.

Figure 7:
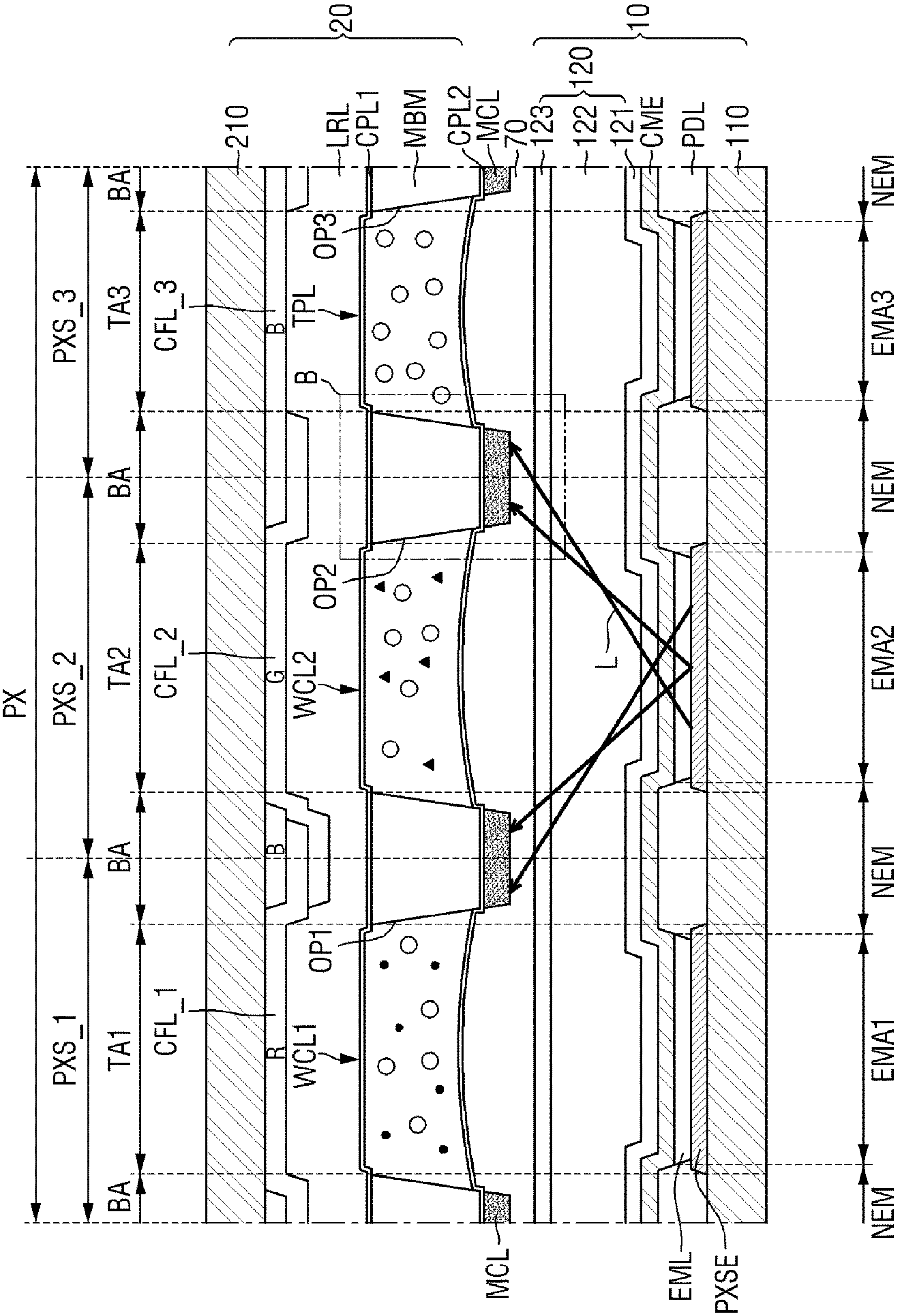
FIG. 7 is a cross-sectional view of an embodiment of a display device.
Figure 8:
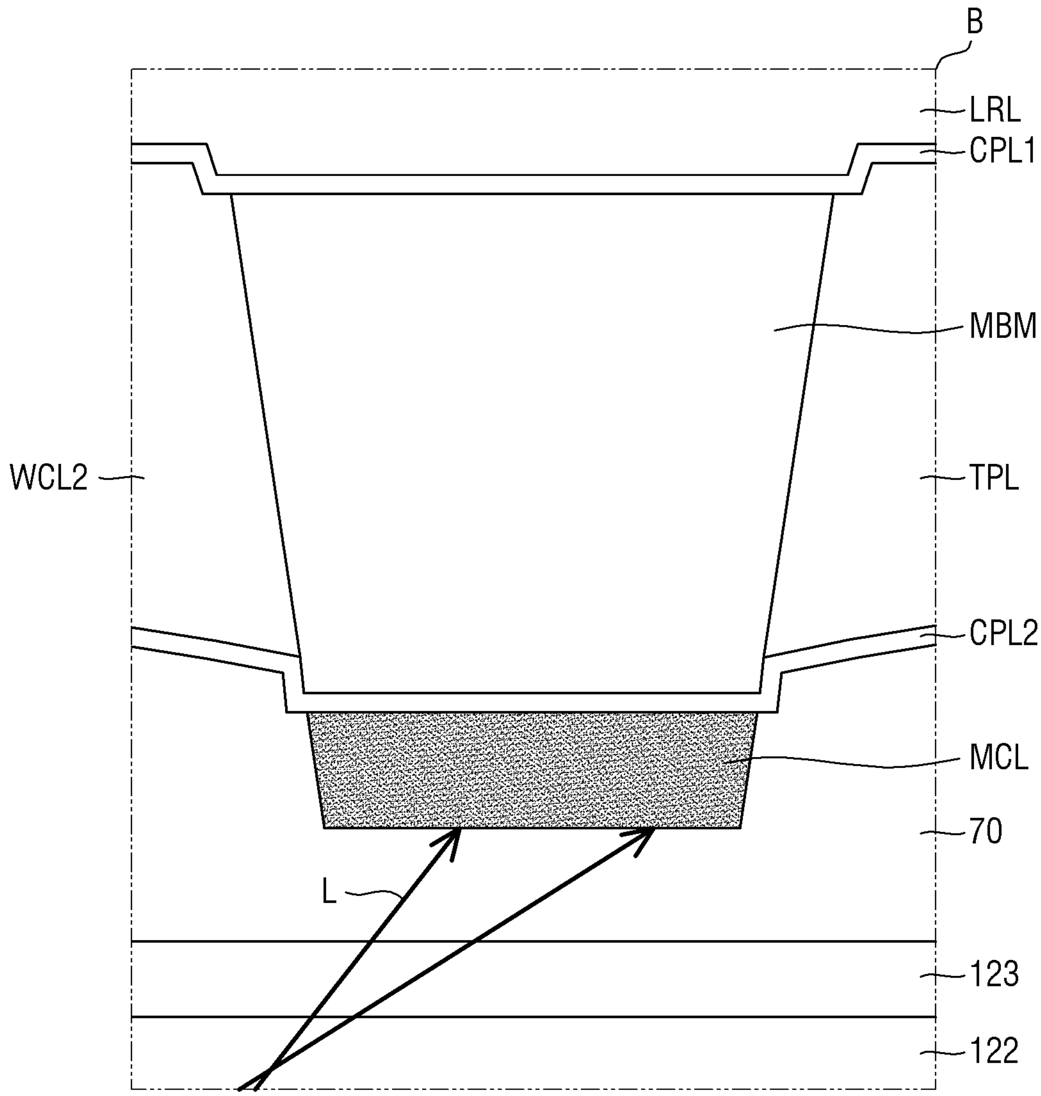
FIG. 8 is an enlarged cross-sectional view of area B of FIG. 7.

The color mixing prevention layer MCL may be disposed on the second capping layer CPL2. That is, the color mixing prevention layer MCL may face the bank layer MBM with the second capping layer CPL2 therebetween. FIGS. 7 and 8 are further referred to describe the color mixing prevention layer MCL in more detail. In addition, although not illustrated, a spacer (not shown) that maintains a cell gap (or distance) between the first display substrate 10 and the second display substrate 20 may be further disposed on the second capping layer CPL2.

FIG. 7 is a cross-sectional view of an embodiment of a display device 1. FIG. 8 is an enlarged cross-section view of area B of FIG. 7. FIG. 7 shows a path of a portion of light emitted from the light emitting layer EML of the display device 1.

Referring further to FIGS. 7 and 8, the color mixing prevention layer MCL may overlap the bank layer MBM. Although not limited to the following, an entirety of the planar area of the color mixing prevention layer MCL may overlap the bank layer MBM. Referring back to FIG. 4, for example, an entirety of a color absorbing layer (e.g., the color mixing prevention layer MCL) corresponds to the bank layer MBM, each of the color absorbing layer and the bank layer MBM has a planar area, and the planar area of the color absorbing layer is smaller than the planar area of the bank layer MBM. The planar area of the color absorbing layer and the planar area of the bank layer MBM each has a planar pattern, and the planar pattern of the color absorbing layer is different from the planar pattern of the bank layer MBM.

The second capping layer CPL2 is positioned between the color mixing prevention layer MCL and the bank layer MBM. That is, a capping layer (e.g., the second capping layer CPL2) includes a first area corresponding to a color absorbing layer (e.g., the color mixing prevention layer MCL), the bank layer MBM includes a second area corresponding to the color absorbing layer, and the first area of the capping layer is between the second area of the bank layer MBM and the color absorbing layer.

The color mixing prevention layer MCL may block at least a portion of light in a visible wavelength band. The color mixing prevention layer MCL (e.g., color absorbing pattern or color absorbing layer) may include a light absorbing material capable of absorbing at least a portion of light in a visible wavelength band. The light absorbing material may include, for example, a black dye, black pigment or the like, but is not limited thereto. In an embodiment, the color mixing prevention layer MCL may absorb all light in a visible wavelength band. Therefore, the color mixing prevention layer MCL may block most of light in a visible wavelength band, for example, may block red light, green light, blue light and the like.

Since the color mixing prevention layer MCL is disposed on the second capping layer CPL2, the color mixing between pixels PX which are adjacent to each other and/or between sub-pixels PXS which are adjacent to each other is suppressed or effectively prevented, and the color matching rate of the display device 1 can be improved.

Specifically, the color mixing prevention layer MCL may suppress or prevent light L emitted from each of the emission regions EMA1, EMA2 and EMA3 of each the sub-pixels PXS from entering the color control layer WCL and TPL of an adjacent one of the sub-pixels PXS. In an embodiment, for example, most of the light L emitted from the light emitting layer EML disposed in the second emission region EMA2 may enter the second wavelength conversion pattern WCL2 thereabove, but a portion of the light L may be directed to the first wavelength conversion pattern WCL1 and/or the light transmitting layer TPL which are adjacent to the second wavelength conversion pattern WCL2. The color mixing prevention layer MCL may absorb the light L directed to the first wavelength conversion pattern WCL1 and/or the light transmitting layer TPL, as a portion of the light L emitted from the light emitting layer EML disposed in the second emission region EMA2, to block the light L directed to the first wavelength conversion pattern WCL1 and/or the light transmitting layer TPL before the light L reaches the first wavelength conversion pattern WCL1 and/or the light transmitting layer TPL. The color mixing prevention layer MCL is closer to the light emitting layer EML than the bank layer MBM.

Accordingly, as the color mixing prevention layer MCL is disposed below the bank layer MBM, suppression or effective prevention of a portion of the light L emitted from the light emitting layer EML disposed in the second emission region EMA2 from entering an unwanted region (e.g., the first wavelength conversion pattern WCL1 and/or the light transmitting layer TPL) is possible. Accordingly, in the display device 1 (see FIG. 1), the color mixing can be reduced or effectively prevented, and the color matching rate can be improved.

In addition, the color mixing prevention layer MCL may block the light L directed to the bank layer MBM as a portion of the light L emitted from the light emitting layer EML disposed in the second emission region EMA2. Accordingly, suppression or effective prevention of a portion of the light L emitted from the light emitting layer EML disposed in the second emission region EMA2 from penetrating the bank layer MBM to enter the neighboring first wavelength conversion pattern WCL1 or light transmitting layer TPL is possible, thereby further suppressing or effectively preventing the color mixing between pixels PX and/or between sub-pixels PXS which are adjacent to each other, and improving the color matching rate of the display device 1.

In the above, a description has been made based on light emission from the second emission region EMA2, but the same description may be applied to the first emission region EMA1 and the third emission region EMA3, and may also be applied to sub-pixels PXS in pixels PX which are adjacent to each other.

Hereinafter, a method of providing or fabricating the display device 1 will be described.

FIGS. 9 to 12 are cross-sectional views showing structures in an embodiment of a method of providing or fabricating a display device 1. FIGS. 9 to 12 illustrate a process of providing the second display substrate 20 of FIG. 5. In FIGS. 9 to 12, for simplicity of description, the second display substrate 20 of FIG. 5 is illustrated in an upside-down shape.

Figure 9:
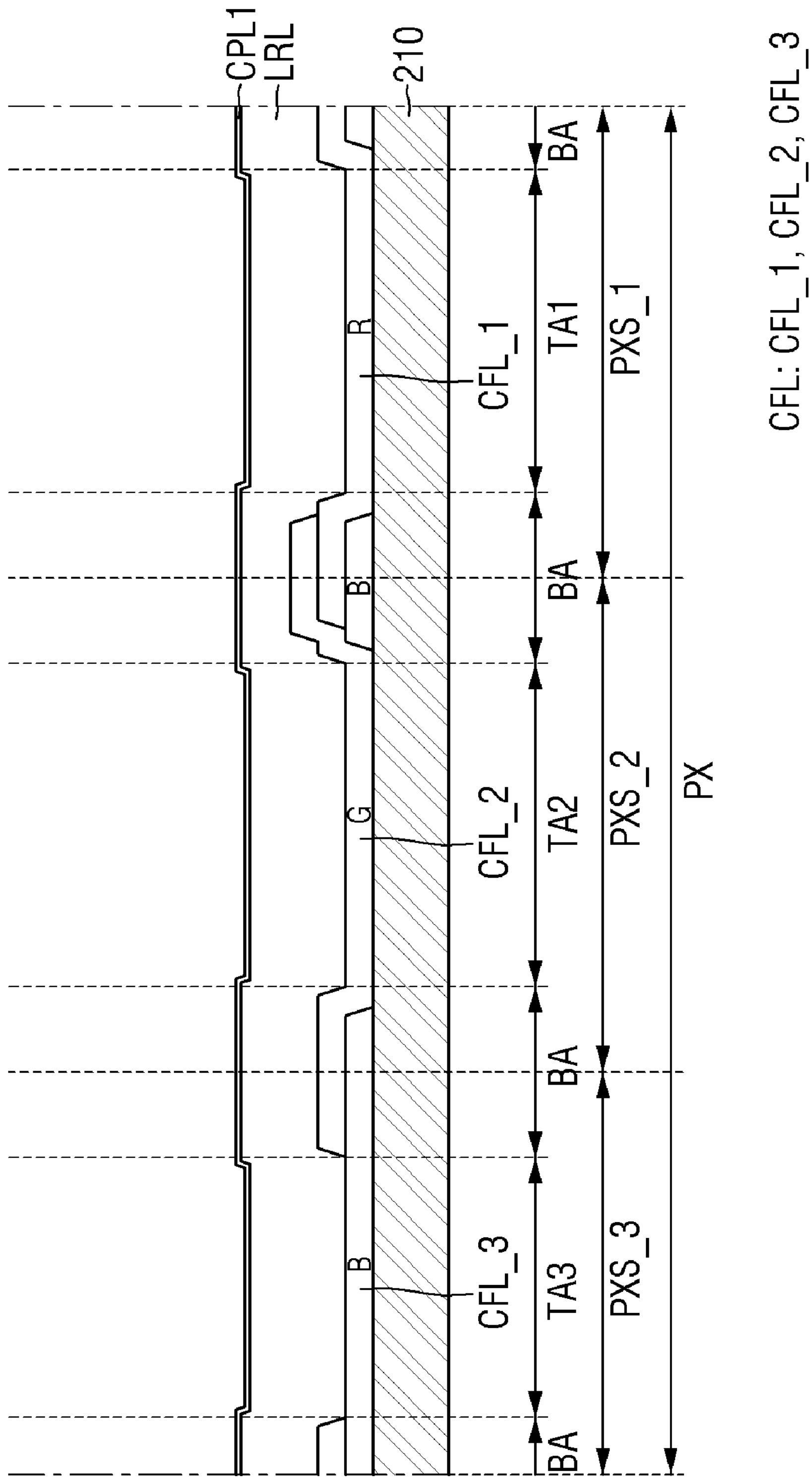
FIGS. 9 to 12 are cross-sectional views showing structures in an embodiment of a method for providing a display device.

Referring to FIG. 9, the color filter layers CFL are provided or formed on a surface of the second substrate 210 of the second display substrate 20 (see FIG. 5).

Specifically, the color filter layers CFL may include the first color filter layer CFL_1, the second color filter layer CFL_2 and the third color filter layer CFL_3. The color filter layers CFL, e.g., the first to third color filter layers CFL_1, CFL_2 and CFL_3 may be provided or formed by applying a photosensitive organic material including a colorant having a color and then exposing and developing the photosensitive organic material. The first to third color filter layers CFL_1, CFL_2 and CFL_3 may be provided or formed from the second substrate 210 in the order of the third color filter layer CFL_3, the first color filter layer CFL_1 and the second color filter layer CFL_2, although not limited thereto.

The third color filter layer CFL_3 may be provided or formed by applying a photosensitive organic material including a third colorant and then exposing and developing the photosensitive organic material including the third colorant to provide patterns of the third color filter layer CFL_3. In an embodiment, for example, a photosensitive organic material having a blue colorant is applied and then exposed and developed to provide patterns of the third color filter layer CFL_3. As a result, as shown in FIG. 9, the third color filter layer CFL_3 which is patterned from a photosensitive organic material including a third colorant may be provided or formed. The first color filter layer CFL_1 and the second color filter layer CFL_2 may be provided or formed in substantially the same way as the forming of the third color filter layer CFL_3. However, the order of providing or forming the color filter layers CFL is not limited thereto.

The low refractive layer LRL and the first capping layer CPL1 are provided or formed on the color filter layers CFL which are patterned layers of materials respectively including a colorant to cover the color filter layers CFL. The low refractive layer LRL and the first capping layer CPL1 may be disposed over the entire planar area of the second substrate 210.

Figure 10:
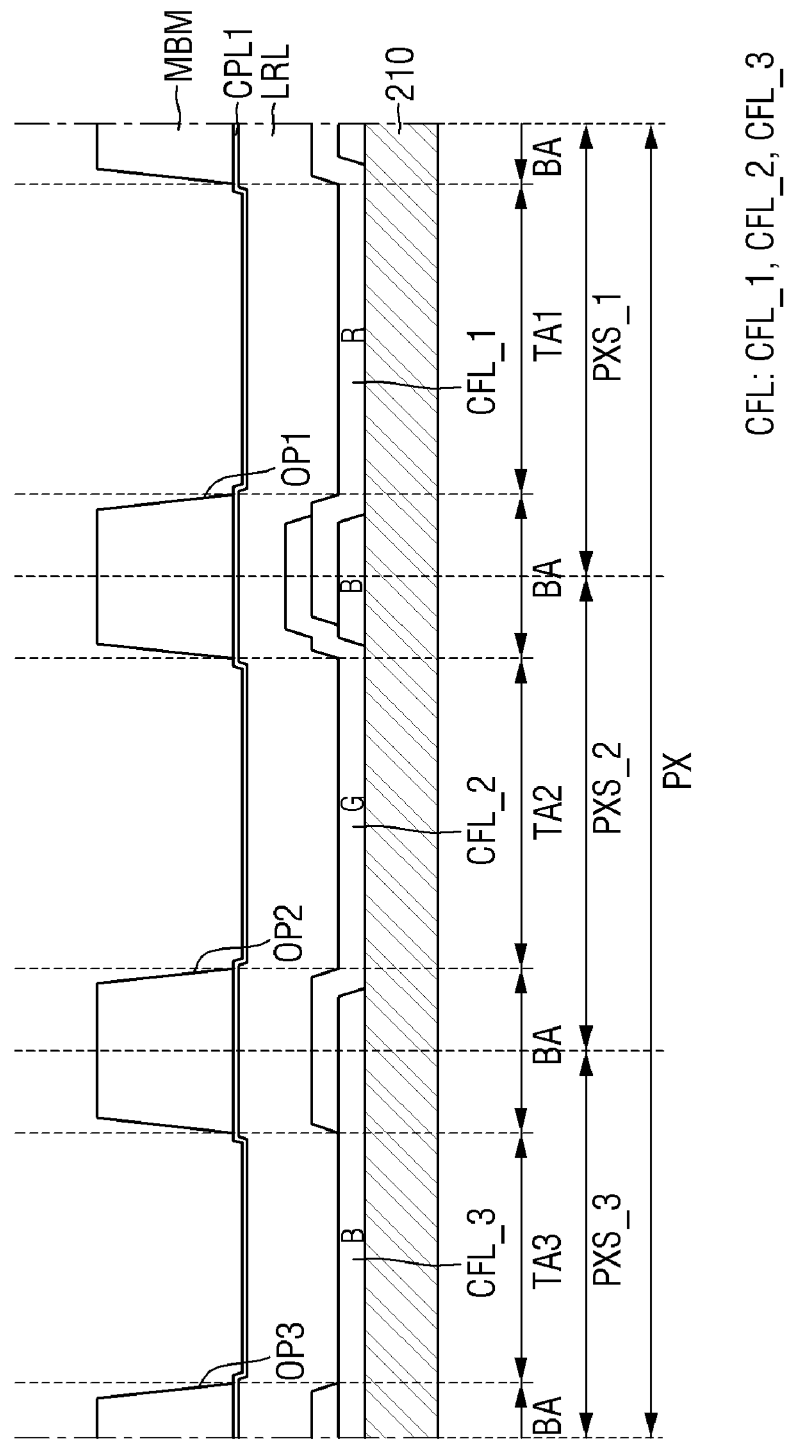

Referring to FIG. 10, the bank layer MBM is provided or formed on the first capping layer CPL1. The bank layer MBM defines openings OP1, OP2 and OP3 which each expose the first capping layer CPL1 to outside the bank layer MBM at the sub-pixels PXS.

Specifically, the bank layer MBM may be provided or formed on the first capping layer CPL1. The bank layer MBM may be disposed in the light blocking region BA. The bank layer MBM may be provided or formed through an exposure and development process such as by using a photomask. In an embodiment, for example, the bank layer MBM may include an organic material, and the organic material may be a photosensitive organic material. In an embodiment, the bank layer MBM may be provided or formed by applying an organic material layer and then exposing and developing the organic material layer to provide patterns of the bank layer MBM. The organic material layer from which the bank layer MBM is provided may be made of a negative photosensitive material which is cured at a portion thereof irradiated with light, but is not limited thereto.

Figure 11:
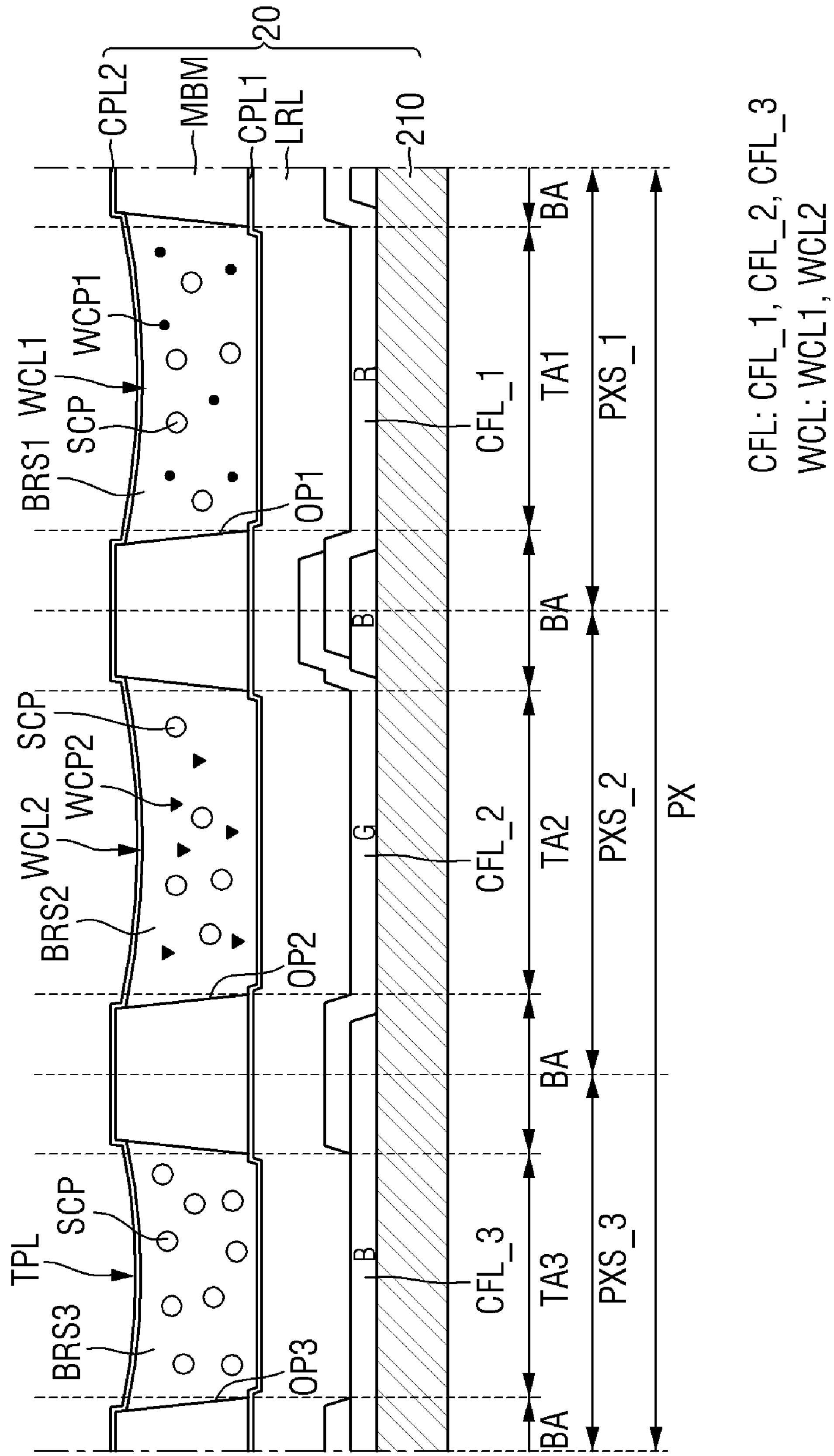

Referring to FIG. 11, the color control layer WCL and TPL is formed in the openings OP1, OP2 and OP3 defined by the bank layer MBM which is patterned. The color control layer WCL and TPL may be formed by an inkjet printing process using an inkjet composition, but is not limited thereto. The patterns of the color control layer WCL and TPL may contact the first capping layer CPL1 at portions thereof which are exposed at the openings OP1, OP2 and OP3.

Specifically, the first wavelength conversion pattern WCL1 may be provided or formed such as by injecting, to the first light transmission region TA1, a first ink (not shown) including a material included in the first wavelength conversion pattern WCL1. The second wavelength conversion pattern WCL2 may be provided or formed such as by injecting, to the second light transmission region TA2, a second ink (not shown) including a material included in the second wavelength conversion pattern WCL2. The light transmitting layer TPL may be provided or formed such as by injecting, to the third light transmission region TA3, a third ink (not shown) including a material included in the light transmitting layer TPL.

The second capping layer CPL2 is provided or formed on the bank layer MBM and on the color control layer WCL and TPL.

Specifically, a material of the color control layer WCL and TPL may be cured. In an embodiment, an original pattern of material for providing the first wavelength conversion pattern WCL1, the second wavelength conversion pattern WCL2 and the light transmitting layer TPL may be shrunk by curing of the material. After curing the material from which the color control layer WCL and TPL is provided, the second capping layer CPL2 may be provided or formed. The second capping layer CPL2 may be provided or formed over the entire area of the second substrate 210.

Figure 12:
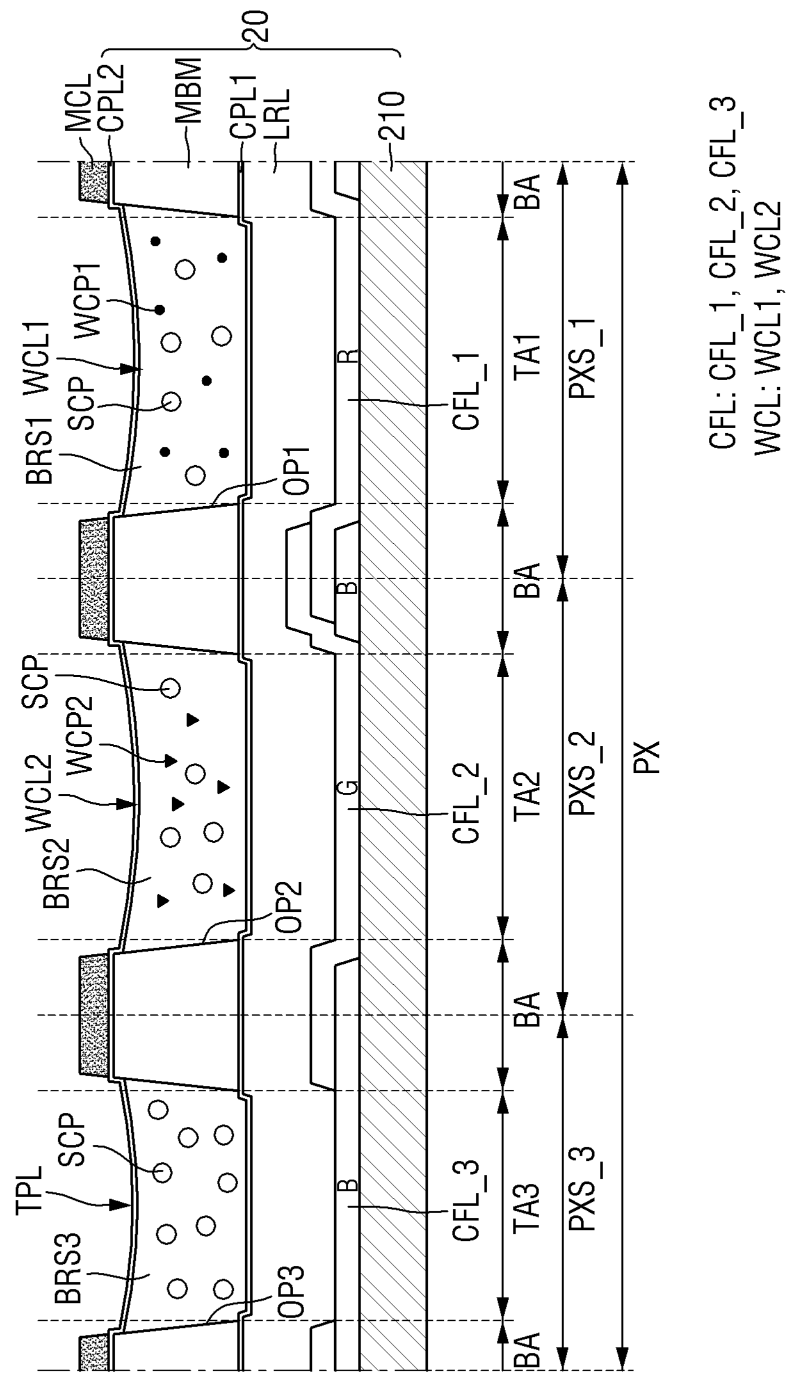

Referring to FIG. 12, the color mixing prevention layer MCL is provided or formed on the second capping layer CPL2.

Specifically, a color mixing prevention layer MCL may be provided or formed on the second capping layer CPL2. The color mixing prevention layer MCL may be disposed in the light blocking region BA. The color mixing prevention layer MCL may be provided or formed through an exposure and development process. In an embodiment, for example, the color mixing prevention layer MCL may include an organic material, and the organic material may include a photosensitive organic material. In an embodiment, the color mixing prevention layer MCL may be provided or formed by applying an organic material layer and then exposing and developing the organic material layer to provide the color mixing prevention layer MCL as a patterned layer. The organic material layer from which the color mixing prevention layer MCL is provided may include or be made of a negative photosensitive material which is cured in a portion thereof irradiated with light, but is not limited thereto.

In addition, the organic material layer from which the color mixing prevention layer MCL is provided layer may further include a light absorbing material. That is, the color mixing prevention layer MCL may be a patterned light absorbing layer.

The color mixing prevention layer MCL may be provided or formed after the color control layer WCL and TPL and the second capping layer CPL2 are provided or formed. Accordingly, the color mixing prevention layer MCL does not directly contact the bank layer MBM having a lyophobic component, and the material layer from which the color mixing prevention layer MCL is provided may be patterned at a desired position on the second capping layer CPL2, thereby improving the reliability of the display device 1 (see FIG. 1).

Referring back to FIG. 5, the filling layer 70 may be applied on the second capping layer CPL2 and the color mixing prevention layer MCL to bond the first display substrate 10 to the second display substrate 20. That is, a filler (e.g., the filling layer 70) covers a color absorbing layer (e.g., color mixing prevention layer MCL) and a layer which includes both the bank layer MBM and the wavelength control pattern and is in direct contact with the color absorbing layer. For convenience of explanation, repeated detailed description thereof will be omitted.

Figure 13:
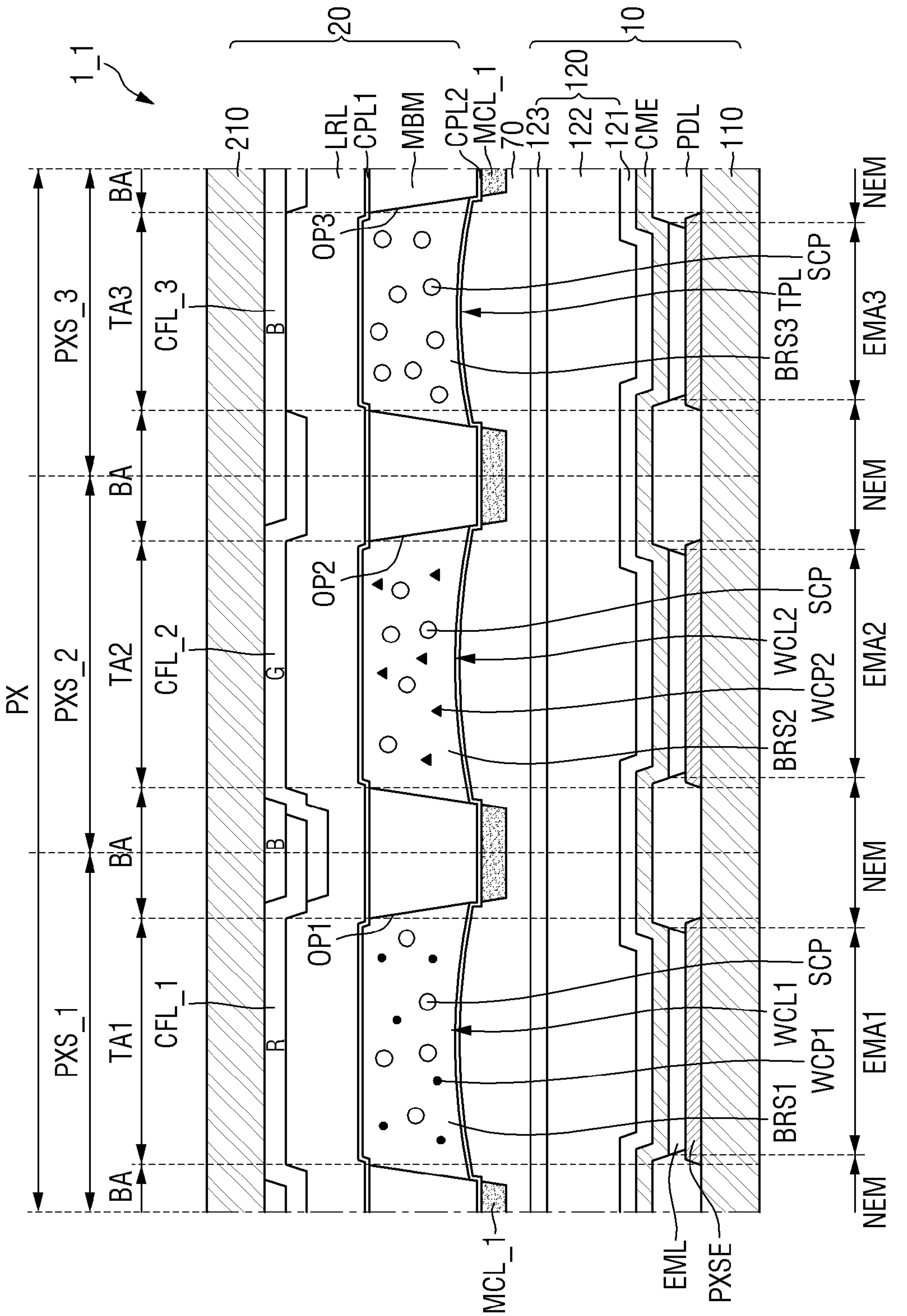
FIG. 13 is a cross-sectional view of an embodiment of a display device.

FIG. 13 is a cross-sectional view of an embodiment of a display device 1_1. A description of the same components described above will be omitted or simplified, and differences will be mainly described.

Referring to FIG. 13, a display device 1_1 is different from that of the embodiment of FIG. 5 in that the display device 1_1 includes a color mixing prevention layer MCL_1, and the color mixing prevention layer MCL_1 transmits red light. That is, the color absorbing layer (e.g., color mixing prevention layer MCL_1) blocks both the blue light and the green light which is emitted from the light emitting element, and transmits red light.

Specifically, the color mixing prevention layer MCL_1 may include a light absorbing material, and the light absorbing material may include a red dye or a red pigment. In other words, the color mixing prevention layer MCL_1 may absorb and block blue light and green light, but may transmit red light.

Light emitted from the light emitting layer EML includes one of blue light having a blue wavelength band or green light having a green wavelength band. Even if the color mixing prevention layer MCL_1 transmits red light, blue light and green light may be blocked. Therefore, the color mixing prevention layer MCL_1 may block the light from one of the pixels PX of sub-pixels PXS which is directed to another one of the pixels PX and/or an adjacent one of the sub pixels PXS, as a portion of the light emitted from the light emitting layer EML.

Due to the color mixing prevention layer MCL_1, the color mixing between pixels PX and/or between sub-pixels PXS which are respectively adjacent to each other is further suppressed or effectively prevented, and the color matching rate of the display device 1_1 can be further improved.

Figure 14:
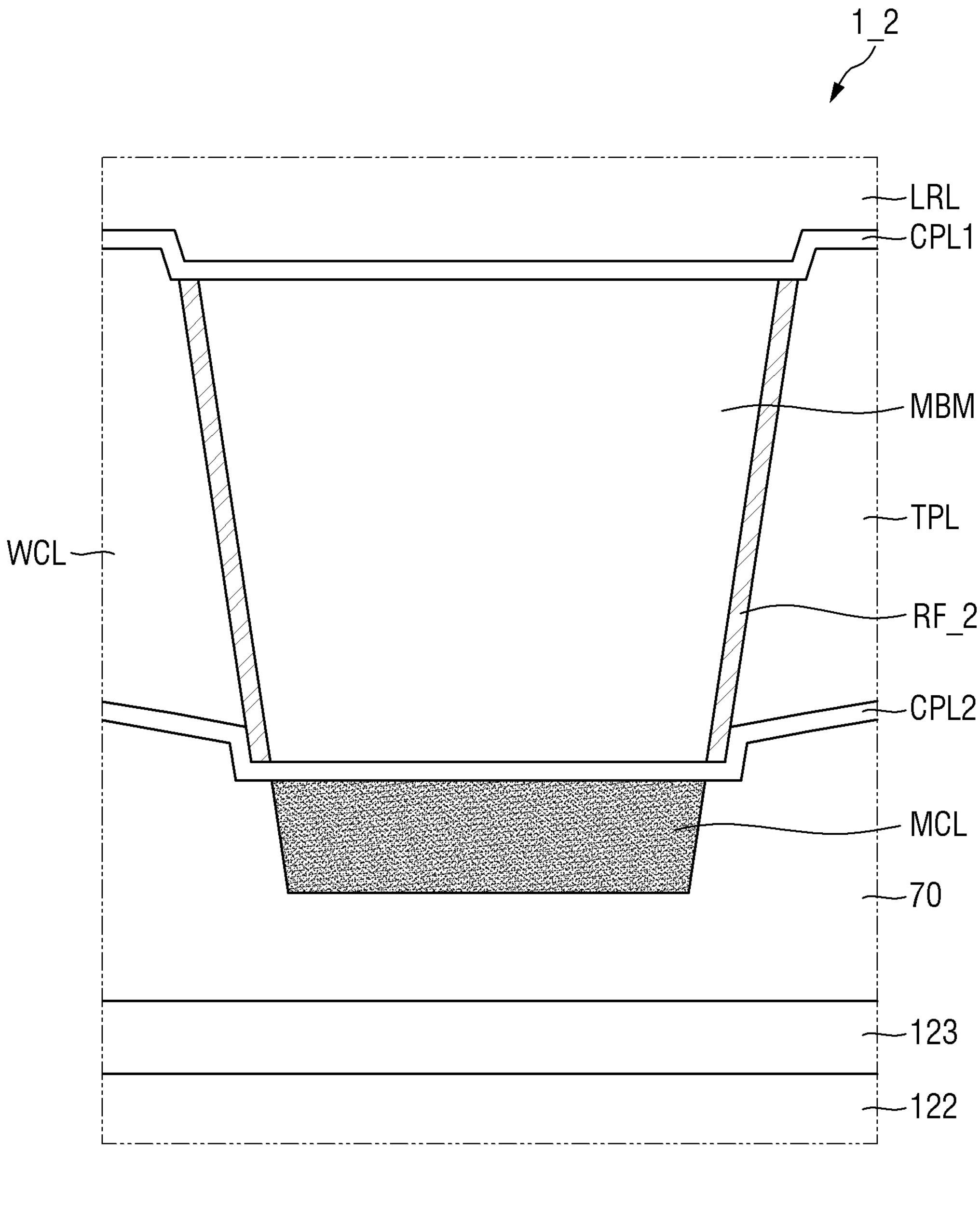
FIG. 14 is an enlarged cross-sectional view showing an embodiment of an area of a display device.

FIG. 14 is an enlarged cross-sectional view showing an embodiment of an area of a display device 1_2.

Referring to FIG. 14, a display device 1_2 is different from that of the embodiment of FIG. 5 in that the display device 1_2 further includes a reflective layer RF_2 in addition to the color mixing prevention layer MCL.

Specifically, the display device 1_2 include the color mixing prevention layer MCL disposed below the bank layer MBM to be closer to the light emitting layer EML than the bank layer MBM, and may further include the reflective layer RF_2 disposed on the side surface or sidewall of the bank layer MBM which defines an opening thereof. The reflective layer RF_2 may be disposed on the side surface of the bank layer MBM and between the bank layer MBM and the color control layer WCL and TPL. The second capping layer CPL2 may cover the bank layer MBM and the color control layer WCL and TPL as well as the reflective layer RF_2. The second capping layer CPL2 may contact each of the bank layer MBM, the color control layer WCL and TPL and the reflective layer RF_2.

Due to the color mixing prevention layer MCL, the color mixing between pixels PX and/or between sub-pixels PXS which are respectively adjacent to each other is further suppressed or effectively prevented, and the color matching rate of the display device 1_2 can be further improved. In addition, since the reflective layer RF_2 is further provided, light emitted from the light emitting layer EML (see FIG. 5) is reflected by the reflective layer RF_2 and directed to outside of the display device 1_2 without being absorbed into the bank layer MBM, thereby improving the light efficiency.

Figure 15:
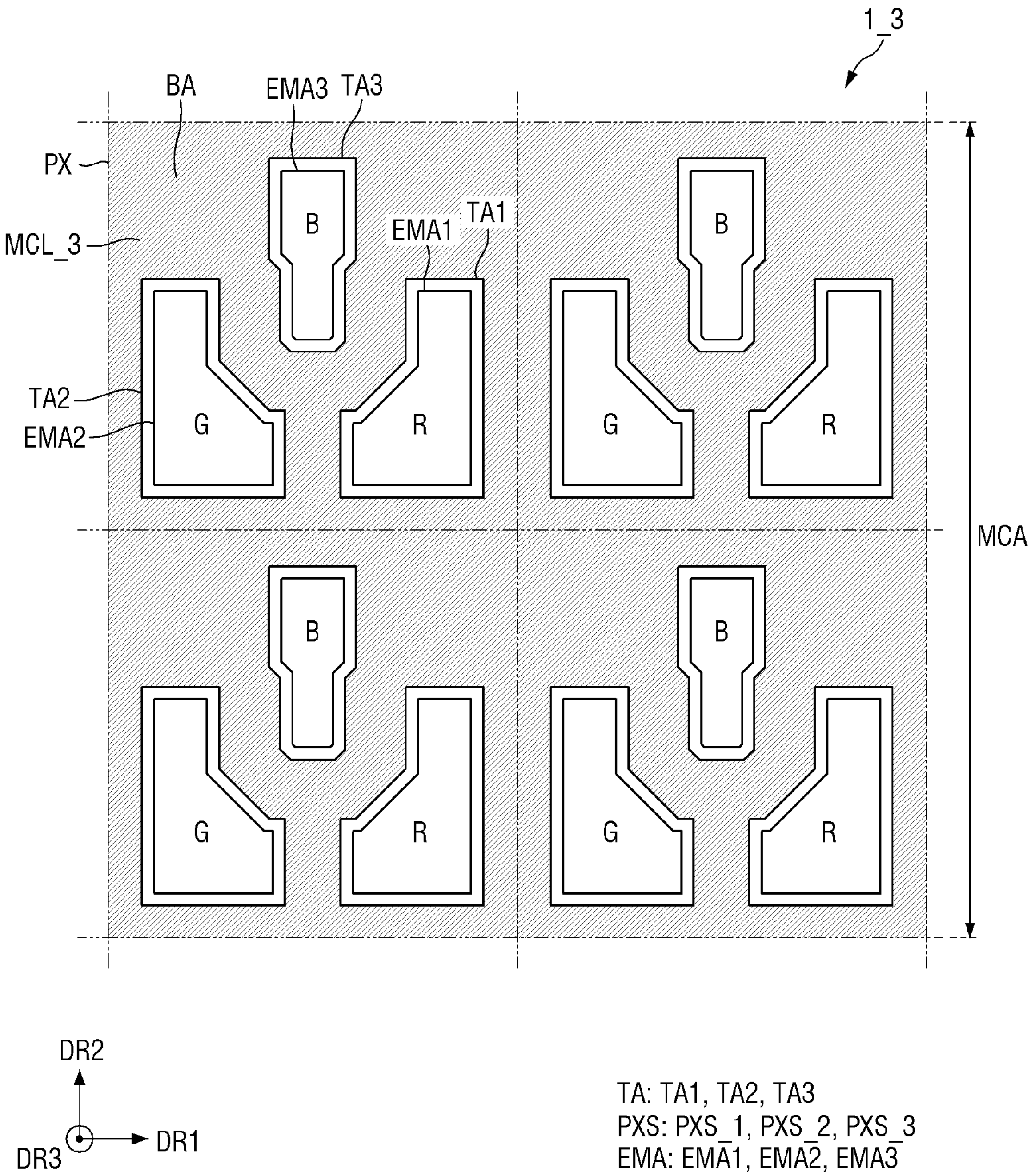
FIG. 15 is a schematic plan view showing an embodiment of a pixel arrangement of a display device.

FIG. 15 is a schematic plan view showing an embodiment of a pixel arrangement of a display device 1_3.

Referring to FIG. 15, a display device 1_3 is different from that of the embodiment of FIG. 4 in that the display device 1_3 includes a color mixing prevention layer MCL_3, and the color mixing prevention layer MCL_3 has substantially the same planar pattern as the light blocking region BA.

Specifically, the color mixing prevention layer MCL_3 may be disposed over the entire light blocking region BA. The color mixing prevention region MCA in which the color mixing prevention layer MCL_3 is disposed may be substantially the same as the light blocking region BA, in a plan view. The planar pattern of the color mixing prevention layer MCL_3 may be substantially the same as the planar pattern of the light blocking region BA.

Although not illustrated, the color mixing prevention layer MCL_3 may be provided or formed in substantially the same pattern as the bank layer MBM (see FIG. 5), in a plan view. The color mixing prevention layer MCL_3 entirely overlaps the bank layer MBM (see FIG. 5), and may have the same planar area as the bank layer MBM in a plan view.

Due to the color mixing prevention layer MCL_3, the color mixing between pixels PX and/or between sub-pixels PXS which are respectively adjacent to each other is further suppressed or effectively prevented, and the color matching rate of the display device 1_3 can be further improved.

In concluding the detailed description, those skilled in the art will appreciate that many variations and modifications can be made to the embodiments without substantially departing from the principles of the present disclosure. Therefore, the disclosed embodiments of the invention are used in a generic and descriptive sense only and not for purposes of limitation.

What is claimed is:

1. A method of providing a display device, comprising:

providing a bank layer defining an opening on a substrate;

providing a color control layer in the opening;

providing a capping layer covering the bank layer and the color control layer;

after providing the capping layer, providing a color absorbing material layer on the capping layer;

patterning the color absorbing material layer on the capping layer, to provide a color absorbing pattern corresponding to the bank layer; and providing a light emitting element substrate closer to the color absorbing pattern than each of the bank layer and the color control layer, wherein the capping layer includes a first area corresponding to the color absorbing pattern, the bank layer includes a second area corresponding to the color absorbing pattern, and the first area of the capping layer is between the color absorbing pattern and the second area of the bank layer.

2. The method of claim 1, wherein the providing of the color absorbing pattern comprises exposing and developing the color absorbing material layer by using a photomask.

3. The method of claim 1, wherein the color absorbing material layer includes a red pigment or a red dye, blocks blue light and green light, and transmits red light.

* * * * *